US012701925B2

(12) United States Patent
Amiri

(10) Patent No.: US 12,701,925 B2
(45) Date of Patent: Aug. 4, 2026

(54) MAGNETIC MEMORY DEVICES HAVING A LOW SWITCHING VOLTAGE

(71) Applicant: Northwestern University, Evanston, IL (US)

(72) Inventor: Pedram Khalili Amiri, Wilmette, IL (US)

(73) Assignee: Northwestern University, Evanston, IL (US)

( * ) Notice: Subject to any disclaimer, the term of this patent is extended or adjusted under 35 U.S.C. 154(b) by 663 days.

(21) Appl. No.: 18/068,173

(22) Filed: Dec. 19, 2022

(65) Prior Publication Data

US 2023/0210014 A1      Jun. 29, 2023

Related U.S. Application Data

(60) Provisional application No. 63/293,363, filed on Dec. 23, 2021.

(51) Int. Cl.
| | |
|---|---|
| *H10N 50/10* | (2023.01) |
| *G11C 11/16* | (2006.01) |
| *H01F 10/32* | (2006.01) |
| *H10B 61/00* | (2023.01) |
| *H10N 50/01* | (2023.01) |
| *H10N 50/85* | (2023.01) |

(52) U.S. Cl.
CPC ........... *H10N 50/10* (2023.02); *G11C 11/161* (2013.01); *H01F 10/3286* (2013.01); *H10B 61/00* (2023.02); *H10N 50/01* (2023.02); *H10N 50/85* (2023.02)

(58) Field of Classification Search
CPC ........ H10N 50/10; H10N 50/01; H10N 50/85; H10B 61/00; G11C 11/161

USPC ......................................................... 257/421
See application file for complete search history.

(56) References Cited

U.S. PATENT DOCUMENTS

| | | | | |
|---|---|---|---|---|
| 9,337,415 | B1 * | 5/2016 | Oh ........................ | G11C 11/161 |
| 11,069,390 | B2 * | 7/2021 | Hu ...................... | H01F 10/3281 |
| 2013/0230741 | A1 * | 9/2013 | Wang .................... | G11C 11/161 |
| | | | | 427/131 |

(Continued)

OTHER PUBLICATIONS

Vinasco et al., "Voltage-Controlled Magnetic Dynamics in Nanoscale Magnetic Tunnel Junctions" UCLA, 2014, pp. 1-194.

(Continued)

*Primary Examiner* — Jami Valentine Miller
(74) *Attorney, Agent, or Firm* — Benesch Friedlander Coplan & Aronoff LLP

(57)      ABSTRACT

A voltage-controlled magnetic anisotropy (VCMA) magnetic tunnel junction (MTJ) device includes a bottom electrode, a bottom CoFeB fixed layer disposed above and in electrical communication with the bottom electrode, a MgO layer disposed above the bottom CoFeB fixed layer, a top CoFeB free layer disposed above the MgO layer, a Mo capping layer disposed above the top CoFeB free layer, and a top electrode disposed above and in electrical communication with the Mo capping layer. A magnetization state of the top CoFeB free layer is switchable between an original state and an opposite state by applying a switching voltage across the MTJ device for a switching duration corresponding to a half period of a magnetic moment precession of the top CoFeB free layer.

19 Claims, 22 Drawing Sheets

(56) References Cited

U.S. PATENT DOCUMENTS

| | | | | |
|---|---|---|---|---|
| 2016/0027842 | A1* | 1/2016 | Khalili Amiri | H10N 50/80 |
| | | | | 257/421 |
| 2017/0160235 | A1* | 6/2017 | Roizin | G01N 33/0027 |
| 2019/0207092 | A1* | 7/2019 | Pinarbasi | H10N 50/85 |
| 2019/0295618 | A1* | 9/2019 | Araki | G11C 11/1673 |
| 2020/0350493 | A1* | 11/2020 | Pinarbasi | H10N 50/01 |
| 2021/0035620 | A1* | 2/2021 | Wang | H10B 61/10 |
| 2021/0225421 | A1* | 7/2021 | Mihajlovic | H10N 50/10 |
| 2022/0158087 | A1* | 5/2022 | Kuo | H10B 61/00 |
| 2023/0371275 | A1* | 11/2023 | Wang | H10N 50/85 |
| 2025/0212694 | A1* | 6/2025 | Chien | H10B 61/22 |

OTHER PUBLICATIONS

Walter et al., "Ion-gel-gating-induced oxygen vacancy formation in epitaxial $La_{0.5}Sr_{0.5}CoO_3$-δ films from in operando x-ray and neutron scattering" American Physical Society, 2017, vol. 1, pp. 071403.

Walter, et al., "Electrostatic versus Electrochemical Doping and Control of Ferromagnetism in Ion-Gel-Gated Ultrathin La 0.5 Sr 0.5 CoO 3-" American Chemical Society, 2016, vol. 10, pp. 7799-7810.

Wang et al., "Voltage-induced switching in magnetic tunnel junctions with perpendicular magnetic anisotropy" Journal of Physics D: Applied Physics, 2013, vol. 46, pp. 074004.

Wang et al., "Electric-field-assisted switching in magnetic tunnel junctions" Nature Materials, Jan. 2012, vol. 11, pp. 64-68.

Weisheit et al., "Electric Field-Induced Modification of Magnetism in Thin-Film Ferromagnets" Science, Jan. 19, 2007, vol. 315, pp. 349-353.

Yuasa et al., "Characterization of growth and crystallization processes in CoFeB/MgO/CoFeB magnetic tunnel junction structure by reflective high-energy electron diffraction" Applied Physics Letters, Dec. 5, 2005, vol. 87, pp. 242503.

Zhao et al., "Failure and reliability analysis of STT-MRAM" Microelectronics Reliability, 2012, vol. 52, pp. 1848-1852.

Zhu et al., "Magnetoresistive Random Access Memory: The Path to Competitiveness and Scalability" IEEE Xplore, Nov. 2008, vol. 96, No. 11, pp. 1786-1798.

Zhu et al., "In Situ Nanoscale Electric Field Control of Magnetism by Nanoionics" Advanced Materials, 2016, vol. 28, pp. 7658-7665.

Akerman, Johan, "Toward a Universal Memory", Science, Apr. 22, 2005, vol. 308, pp. 508-511.

Almasi et al., "Enhanced tunneling magnetoresistance and perpendicular magnetic anisotropy in Mo/CoFeB/MgO magnetic tunnel junctions" Applied Physics Letters, May 6, 2015, vol. 106, pp. 182406.

Amiri et al., "Electric-Field-Controlled Magnetoelectric RAM: Progress, Challenges, and Scaling" IEEE Xplore, Nov. 2015, vol. 51, No. 11, pp. 3401507.

Barnes et al., "Rashba Spin-Orbit Anisotropy and the Electric Field Control of Magnetism" Scientific Reports, Feb. 17, 2014, vol. 4, No. 4105, pp. 1-5.

Bauer et al., "Magneto-ionic control of interfacial magnetism" Nature Materials, Feb. 2015, vol. 14, pp. 174-181.

Bauer et al., "Voltage-controlled domain wall traps in ferromagnetic nanowires" Nature Nanotechnology, Jun. 2013, vol. 8, pp. 411-416.

Bi et al., "Reversible Control of Co Magnetism by Voltage-Induced Oxidation" American Physical Society, Dec. 31, 2014, vol. 113, pp. 267202.

Blochl, P.E, "Projector augmented-wave method" Physical Review B, Dec. 15, 1994, vol. 50, No. 24, pp. 953-979.

Brataas et al., "Current-induced torques in magnetic materials" Nature Materials, May 2012, vol. 11, pp. 373-381.

Brown, William Fuller, Jr, "Thermal Fluctuations of a Single-Domain Particle" Physical Review, Jun. 1, 1963, vol. 130, No. 5, pp. 1677-1686.

Chun et al., "A Scaling Roadmap and Performance Evaluation of In-Plane and Perpendicular MTJ Based STT-MRAMs for High-Density Cache Memory", IEEE Journal of Solid-State Circuits, Feb. 2013, vol. 48, No. 2, pp. 598-610.

Dasgupta et al., "Toward On-and-Off Magnetism: Reversible Electrochemistry to Control Magnetic Phase Transitions in Spinel Ferrites" Advanced Functional Materials, 2016, vol. 26, pp. 7507-7515.

Di et al., "Influence of controlled surface oxidation on the magnetic anisotropy of Co ultrathin films" Applied Physics Letters, Mar. 27, 2015, vol. 106, pp. 122405.

Duschek et al., "Electrochemical and in situ magnetic study of iron/iron oxide films oxidized and reduced in KOH solution for magneto-ionic switching" Electrochemistry Communications, 2016, vol. 72, pp. 153-156.

Gilbert et al., "Structural and magnetic depth profiles of magneto-ionic heterostructures beyond the interface limit" Nature Communications, Jul. 22, 2016, vol. 7, pp. 1-8.

Gilbert et al., "Controllable positive exchange bias via redox-driven oxygen migration" Nature Communications, Mar. 21, 2016, vol. 7, pp. 1-8.

Grezes et al., "Ultra-low switching energy and scaling in electric-field-controlled nanoscale magnetic tunnel junctions with high resistance-area product" Applied Physics Letters, Jan. 4, 2016, vol. 108, pp. 012403.

Grezes et al., "In-plane magnetic field effect on switching voltage and thermal stability in electric-field-controlled perpendicular magnetic tunnel junctions" AIP Advances, Jul. 19, 2016, vol. 6, pp. 075014.

Grutter et al., "Reversible control of magnetism in La 0.67 Sr 0.33 MnO 3 through chemically-induced oxygen migration" Applied Physical Letters, vol. 108, pp. 082405.

Hoffman et al., "Magnetic bit stability: Competition between domain-wall and monodomain switching" Applied Physical Letters, vol. 100, pp. 212406.

Kanai et al., "Electric field-induced magnetization reversal in a perpendicular-anisotropy CoFeB—MgO magnetic tunnel junction" Applied Physical Letters, Sep. 18, 2012, vol. 101, pp. 122403.

Kanai et al., "In-plane magnetic field dependence of electric field-induced magnetization switching" Applied Physics Letters, vol. 103, pp. 072408.

Kato et al., "Giant voltage-controlled magnetic anisotropy effect in a crystallographically strained CoFe system" Applied Physics Express, 2018, vol. 11, pp. 053007.

Khalili et al., "Switching current reduction using perpendicular anisotropy in CoFeB—MgO magnetic tunnel junctions" Applied Physics Letters, Mar. 17, 2011, vol. 98, pp. 112507.

Kodzuka et al., "Effects of boron composition on tunneling magnetoresistance ratio and microstructure of CoFeB/MgO/CoFeB pseudo-spin-valve magnetic tunnel junctions" Journal of Applied Physics, Feb. 27, 2012, vol. 111, pp. 043913.

Koelling et al., "A Technique for relativistic spin-polarised calculations" Journal of Physics C: Solid State Physics, 1977, vol. 10, pp. 3107.

Kresse et al., "Efficient iterative schemes for ab initio total-energy calculations using a plane-wave basis set" Physical Review B, Oct. 15, 1996, vol. 54, No. 16, pp. 169-186.

Kwon et al., "Colossal electric field control of magnetic anisotropy at ferromagnetic interfaces induced by iridium overlayer" American Physical Society, 2019, vol. 99, pp. 064434.

Kwon et al., "Voltage-Controlled Magnetic Anisotropy in Heterostructures with Atomically Thin Heavy Metals" American Physical Society, 2019, vol. 12, pp. 044075.

Li et al., "Electric-field control of ferromagnetism through oxygen ion gating" Nature Communications, vol. 8, No. 2156, pp. 1-7.

Li et al., "Predictive Materials Design of Magnetic Random-Access Memory Based on Nanoscale Atomic Structure and Element Distribution" Nano Letters, Nov. 7, 2019, vol. 19, pp. 8621-8629.

Liu et al., "Thermally robust Mo/CoFeB/MgO trilayers with strong perpendicular magnetic anisotropy" Scientific Reports, Jul. 31, 2014, vol. 4, No. 5895, pp. 1-6.

Maruyama et al., "Large voltage-induced magnetic anisotropy change in a few atomic layers of iron" Nature nanotechnology, Mar. 2009, vol. 4, pp. 158-161.

Nakamura et al., "Effect of heavy-metal insertions at Fe/Mgo interfaces on electric-field-induced modification of magnetocrystalline anisotropy" Journal of Magnetism and Magnetic Materials, 2017, vol. 429, pp. 214-220.

(56) References Cited

OTHER PUBLICATIONS

Nozaki et al., "Highly efficient voltage control of spin and enhanced interfacial perpendicular magnetic anisotropy in iridium-doped Fe/MgO magnetic tunnel junctions" NPG Asia Materials, 2017, vol. 9, pp. 1-10.

Nozaki et al., "Voltage-controlled magnetic anisotropy in an ultrathin Ir-doped Fe layer with a CoFe termination layer" APL Materials, Jan. 10, 2020, vol. 8, pp. 011108.

Nozaki et al., "Enhancement in the interfacial perpendicular magnetic anisotropy and the voltage-controlled magnetic anisotropy by heavy metal doping at the Fe/Mgo interface" APL Materials, Feb. 1, 2018, vol. 6, pp. 026101.

Oboril et al., "Evaluation of Hybrid Memory Technologies Using SOT-MRAM for On-Chip Cache Hierarchy" IEEE Transcations on Computer-Aided Design of Integrated Circuits and Systems, Mar. 2015, vol. 34, No. 3, pp. 367-380.

Ong et al., "Electric field control and effect of Pd capping on magnetocrystalline anisotropy in FePd thin films: A first-principles study" Physical Review B, 2014, vol. 89, pp. 094422.

Ong et al., "Giant voltage modulation of magnetic anisotropy instrained heavy metal/magnet/insulator/heterostructures" American Physical Society, 2015, vol. 92, pp. 020407.

Perdew et al., "Generalized Gradient Approximation Made Simple" Physical Review Letters, Oct. 28, 1996, vol. 77, No. 18, pp. 3865-3868.

Ralph et al., "Spin transfer torques" Journal of Magnetism and Magnetic Materials, 2008, vol. 320, pp. 1190-1216.

Rippard et al., "Thermal relaxation rates of magnetic nanoparticles in the presence of magnetic fields and spin-transfer effects" American Physical Society, 2011, vol. 84, pp. 064439.

Sato et al., "Properties of magnetic tunnel junctions with a MgO/CoFeB/Ta/CoFeB/MgO recording structure down to junction diameter of 11 nm" Applied Physics Letters, Aug. 13, 2014, vol. 105, pp. 062403.

Sato et al., "Junction size effect on switching current and thermal stability in CoFeB/MgO perpendicular magnetic tunnel junctions" Applied Physics Letters, Jul. 26, 2011, vol. 99, pp. 042501.

Shiota et al., "Induction of coherent magnetization switching in a few atomic layers of FeCo using voltage pulses" Nature Materials, Jan. 2012, vol. 11, pp. 39-43.

Shiota et al., "Pulse voltage-induced dynamic magnetization switching in magmetic tunneling junctions with high resistance-area product" Applied Physics Letters, Sep. 5, 2012, vol. 101, pp. 102406.

Sun et al., "Effect of subvolume excitation and spin-torque efficiency on magnetic switching" American Physical Society, 2011, vol. 84, pp. 064413.

Sun et al., "Electric field modulation of magnetism in ferrimagnetic Heusler heterostructures" Physical Review B, 2020, vol. 101, pp. 134419.

Villars et al', "Pearson's crystal data: crystal structure database for inorganic compounds" ASM International Materials Park, review/10.5860/Choice.45-3800, 2007.

* cited by examiner $\tau_P = 19.2$ s

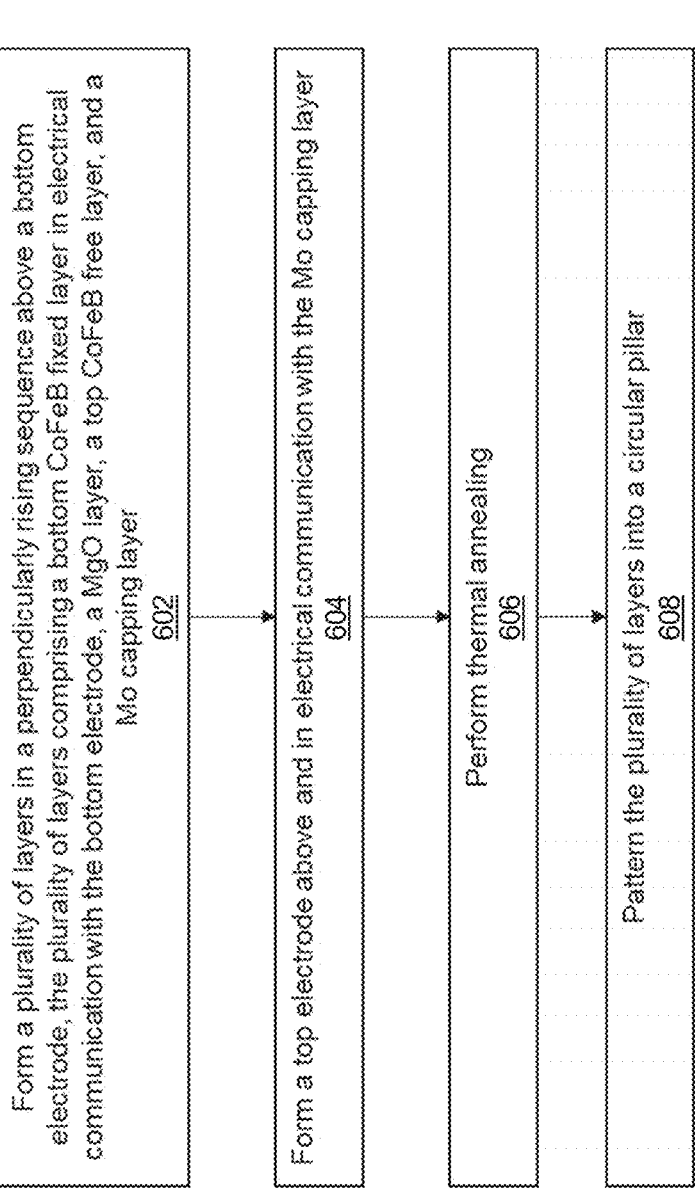

Form a plurality of layers in a perpendicularly rising sequence above a bottom electrode, the plurality of layers comprising a bottom CoFeB fixed layer in electrical communication with the bottom electrode, a MgO layer, a top CoFeB free layer, and a Mo capping layer
602

Form a top electrode above and in electrical communication with the Mo capping layer
604

Perform thermal annealing
606

Pattern the plurality of layers into a circular pillar
608

FIG. 6

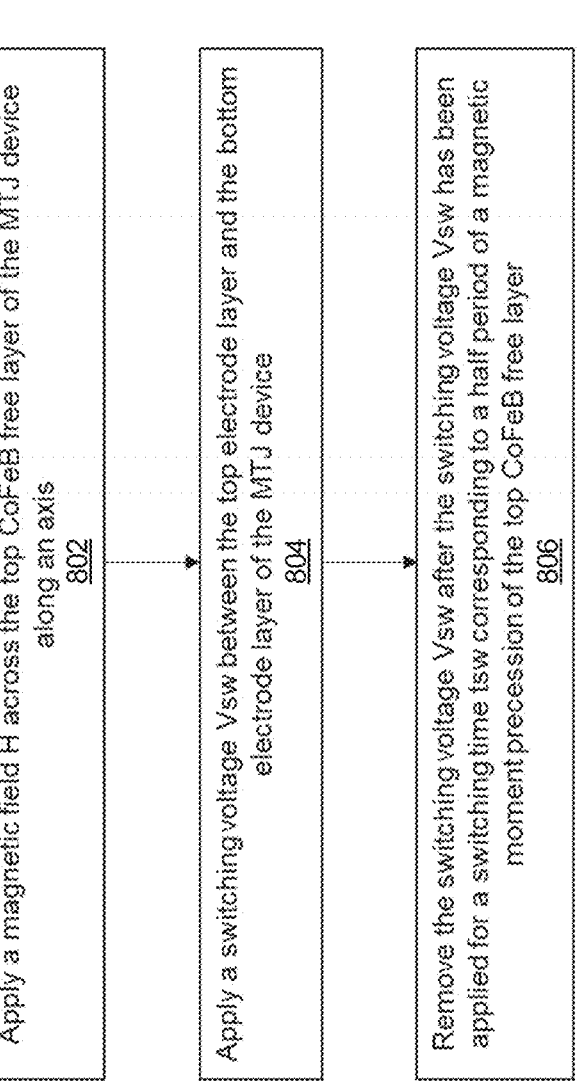

Apply a magnetic field H across the top CoFeB free layer of the MTJ device along an axis
802

Apply a switching voltage Vsw between the top electrode layer and the bottom electrode layer of the MTJ device
804

Remove the switching voltage Vsw after the switching voltage Vsw has been applied for a switching time tsw corresponding to a half period of a magnetic moment precession of the top CoFeB free layer
806

FIG. 8

MAGNETIC MEMORY DEVICES HAVING A LOW SWITCHING VOLTAGE

CROSS REFERENCE TO RELATED APPLICATIONS

The present application claims the benefit of priority under 35 U.S.C. § 119 from U.S. Provisional Patent Application Ser. No. 63/293,363, entitled "Magnetic Memory Devices Having a Low Switching Voltage," filed on Dec. 23, 2021, all of which is incorporated herein by reference in its entirety for all purposes.

STATEMENT OF FEDERALLY FUNDED RESEARCH OR SPONSORSHIP

This invention was made with government support under grant number IIP-1919109 awarded by the National Science Foundation. The government has certain rights in the invention.

TECHNICAL FIELD

The present disclosure generally relates to magnetic memory devices, and more specifically relates to magnetic memory devices having a low switching voltage.

BACKGROUND

Magnetic Tunnel Junction (MTJ) devices having a switching mechanism based on current-induced magnetization reversal using spin-transfer torque (STT) require significant current density through the STT-MTJ device (in particular, for high-speed switching), thus limiting energy efficiency, endurance, and ability to scale the access transistor size. In contrast, voltage-controlled magnetic anisotropy (VCMA) is an alternative writing mechanism for MTJ devices utilizing an electric-field-based principle. VCMA switching may be realized by appropriately timing voltage pulses applied across the VCMA-MTJ devices.

SUMMARY

In an example, a magnetic tunnel junction (MTJ) device may include a bottom electrode. The MJT device may also include a bottom CoFeB fixed layer disposed above and in electrical communication with the bottom electrode. The MJT device may furthermore include a MgO layer disposed above the bottom CoFeB fixed layer. The MJT device may in addition include a top CoFeB free layer disposed above the MgO layer. The MJT device may moreover include a Mo capping layer disposed above the top CoFeB free layer. The MJT device may also include a top electrode disposed above and in electrical communication with the Mo capping layer. Other examples of this aspect include corresponding computer systems, semiconductor fabrication apparatuses, and computer programs recorded on one or more computer storage devices, each configured to perform the actions of the methods.

The described examples may also include one or more of the following features. An MTJ device where: the bottom CoFeB fixed layer may include $Co_{20}Fe_{60}B_{20}$; and the top CoFeB free layer may include $Co_{17.5}Fe_{55}B_{30}$. An MTJ device where: the bottom CoFeB fixed layer has a thickness of about 0.8 nm; the MgO layer has a thickness of about 1.5 nm; the top CoFeB free layer has a thickness of about 1.6 nm; and the Mo capping layer has a thickness of about 5 nm.

An MTJ device where the bottom CoFeB fixed layer, the MgO layer, the top CoFeB free layer, and the Mo capping layer are patterned into a circular vertically-oriented pillar. An MTJ device where the circular vertically-oriented pillar has a diameter within a range from about 50 nm to about 70 nm. An MTJ device where the circular vertically-oriented pillar has a diameter within a range from about 30 nm to about 50 nm. An MTJ device where the circular vertically-oriented pillar has a diameter within a range from about 10 nm to about 30 nm. An MTJ device where the bottom electrode includes a Co/Pt-based synthetic antiferromagnetic (SAF) multilayer. An MTJ device where the bottom CoFeB fixed layer and the top CoFeB free layer each have a composition ratio of 1:3 between Co and Fe, and the top CoFeB free layer has a higher B concentration than the bottom CoFeB fixed layer. An MTJ device may include a plurality of MTJ devices and electronic circuitry coupled with the plurality of MTJ devices and the MTJ device and configured as a complementary metal oxide semiconductor (CMOS)-compatible magnetic random-access memory (MRAM). Implementations of the described techniques may include hardware, a method or process, or a computer tangible medium.

Some implementations herein relate to a method of fabricating a voltage-controlled magnetic anisotropy (VCMA) magnetic tunnel junction (MTJ) device. For example, a method may include forming a plurality of layers in a perpendicularly rising sequence above a bottom electrode, the plurality of layers having a bottom CoFeB fixed layer in electrical communication with the bottom electrode, a MgO layer, a top CoFeB free layer, and a Mo capping layer. The method may also include performing thermal annealing. The method may furthermore include patterning the plurality of layers into a circular pillar. Other embodiments of this aspect include corresponding computer systems, apparatus, and computer programs recorded on one or more computer storage devices, each configured to perform the actions of the methods.

The described implementations may also include one or more of the following features. A method where the plurality of layers may be formed to further include a pinning layer between the bottom electrode and the bottom CoFeB fixed layer. The method may include forming a top electrode above and in electrical communication with the Mo capping layer. A method where forming the plurality of layers may include sputter depositing using physical vapor deposition. A method where the circular pillar is patterned with a diameter within a range of about 10 nm to about 30 nm. A method where the circular pillar is patterned with a diameter within a range of about 30 nm to about 50 nm. A method where the circular pillar is patterned with a diameter within a range of about 50 nm to about 70 nm. A method where the circular pillar is patterned using electron beam lithography. In certain methods, a method where the circular pillar is patterned using deep or extreme ultra-violet lithography. A method where the MgO layer is deposited by radio-frequency (RF) sputtering. A method where layers having metallic compounds are deposited by DC sputtering. Examples of the described techniques may include hardware, a method or process, or a computer tangible medium.

Some examples herein relate to a method of switching a free-layer magnetization state of a voltage-controlled magnetic anisotropy (VCMA) magnetic tunnel junction (MTJ) device. For example, the method may include applying a magnetic field H across the top CoFeB free layer of the MTJ device along an axis. The method may also include applying a switching voltage Vsw between the top electrode and the bottom electrode of the MTJ device, where $Vsw=4tMg0EbV=0/(\pi\tau D2)$, tMgO is a thickness of the MgO layer, Eb is an energy barrier between two free-layer magnetization states, $\xi$ is a VCMA coefficient, and D is a diameter of the MTJ device. The method may furthermore include removing the switching voltage Vsw after the switching voltage Vsw has been applied for a switching time tsw corresponding to a half period of a magnetic moment precession of the top CoFeB free layer. Other embodiments of this aspect include corresponding computer systems, apparatus, and computer programs recorded on one or more computer storage devices, each configured to perform the actions of the methods.

The described implementations may also include one or more of the following features. A method where the axis, along which the magnetic field H is applied, is offset by an angle $\theta_H$ from normal to a plane of the plurality of layers of the MTJ device. Implementations of the described techniques may include hardware, a method or process, or a computer tangible medium.

BRIEF DESCRIPTION OF THE DRAWINGS

The disclosure is better understood with reference to the following drawings and description. The elements in the figures are not necessarily to scale, emphasis instead being placed upon illustrating the principles of the disclosure. Moreover, in the figures, like-referenced numerals may designate to corresponding parts throughout the different views.

FIG. 6 is a flowchart that illustrates an exemplary process of fabricating a voltage-controlled magnetic anisotropy (VCMA) magnetic tunnel junction (MTJ) device.

FIG. 8 is a flowchart that illustrates an exemplary process of switching a free-layer magnetization state of a voltage-controlled magnetic anisotropy (VCMA) magnetic tunnel junction (MTJ) device.

Figure 1A:
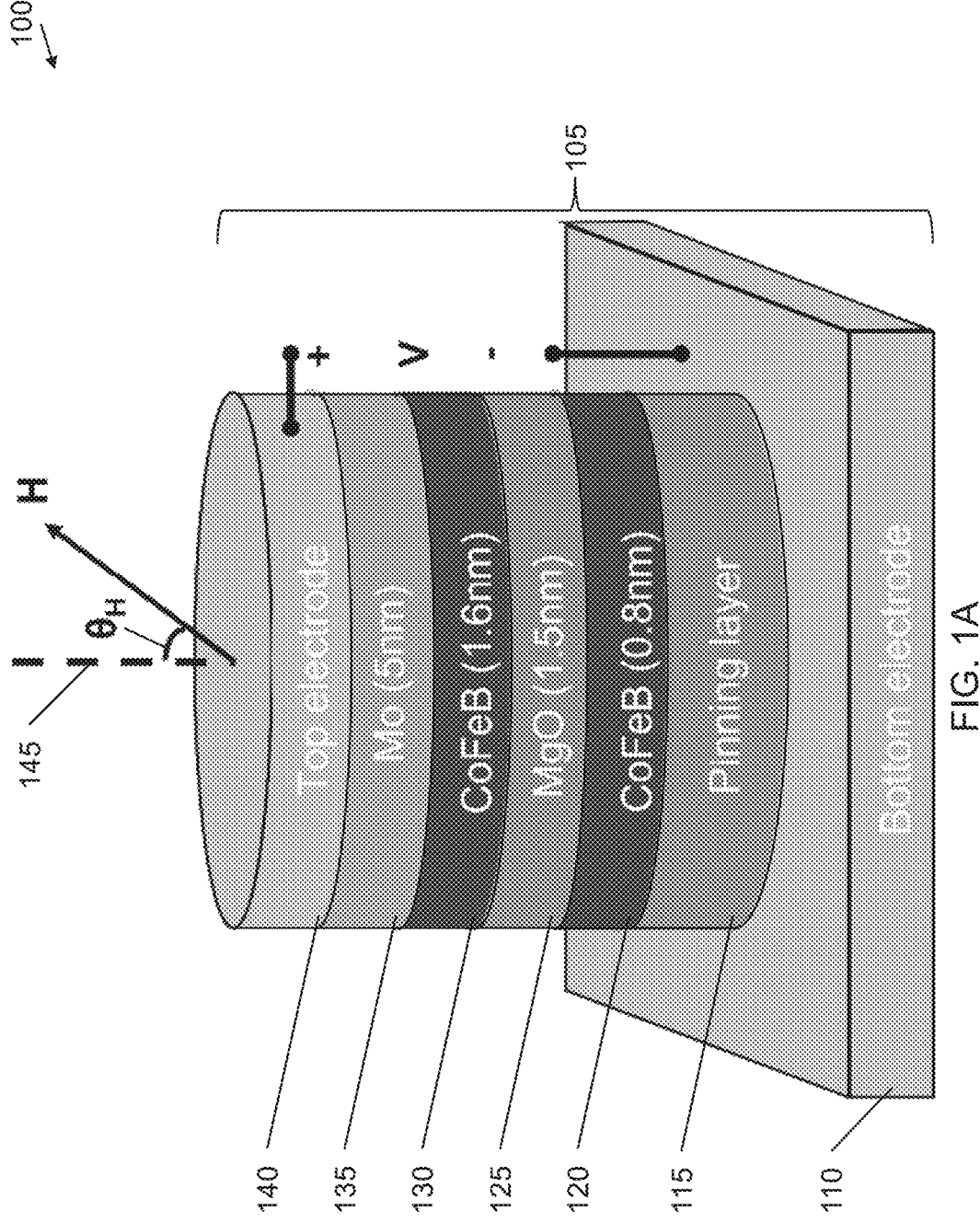
FIG. 1A is a schematic diagram that illustrates an exemplary material stack and structure of an exemplary magnetic tunnel junction (MTJ).

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

The disclosed technology includes a voltage-controlled magnetic memory device, which may be used for embedded memory applications in memory-intensive computing tasks, for example, machine learning, machine vision, artificial neural networks, and high-performance computing. The voltage-controlled magnetic memory device technology described herein may be included in magnetic random access memory (MRAM) devices that may be useful for replacing existing static random access memory (SRAM) and dynamic random access memory (DRAM) memory technologies utilized in computing systems for memory-intensive computing tasks. Compared to existing memory technologies, the technology described herein may provide advantages such as a lower switching voltage, high energy efficiency, higher bit density, and better scalability. The technology described herein may facilitate MRAM devices to address broader markets than existing technologies, for example, current-controlled spin-transfer torque (STT-MRAM) technology. Applications for the technology described herein may include high-density DRAM and embedded SRAM in sub-10 nm nodes. The listed advantages and applications for the technology described herein are examples and should not be construed as limiting, as there may be many other advantages and applications for the technology described herein.

Magnetic random-access memory (MRAM) based on voltage-controlled magnetic anisotropy (VCMA) in magnetic tunnel junctions (MTJs) may be particularly suitable for use in embedded memory applications due to its lower power consumption, higher bit density, and capability to reduce an access transistor size when compared to conventional current-controlled MRAM. Realizing these advantages of VCMA-MRAM may be facilitated by a low MTJ switching voltage. Disclosed herein is a new perpendicular MTJ structure with high VCMA coefficient up to 102 fJ/Vm and simultaneously high tunnel magnetoresistance (e.g., TMR>130%). The high VCMA coefficient may lead to the disclosed demonstration, for the first time, of VCMA-induced sub-nanosecond precessional switching of nanoscale MTJs with a voltage lower than 1 V. Also disclosed is demonstrated scaling of this switching mechanism in MTJs having diameters down to 30 nm. In addition to their novel utilities, capabilities, advantages and applications, the disclosed technology and results pave the path for further development and application of VCMA-MRAM and other voltage-controlled spintronic devices in high-performance computing systems.

Magnetic random-access memory (MRAM) based on perpendicular magnetic tunnel junctions (MTJs) may be incorporated in embedded non-volatile memory and random-access (e.g., cache) memory applications, for example, due to their numerous advantages over prior technologies. These advantages may include low power consumption, relatively high density, small number of masks (e.g., compared to embedded flash memory), and compatibility with complementary metal oxide semiconductor (CMOS) processing. One exemplary desirable feature of MTJ devices for embedded MRAM for cache applications in microprocessors is the ability to switch the direction of the magnetization with high speed (e.g., about 3 ns or less for L2 cache applications) and with low write voltage. The conventional switching mechanism based on current-induced magnetization reversal using spin-transfer torque (STT) requires significant current density through the MTJ (in particular, for high-speed switching), thus limiting its energy efficiency, endurance, and ability to scale the access transistor size. In contrast, voltage-controlled magnetic anisotropy (VCMA) is an alternative writing mechanism having an electric-field-based principle which may overcome limitations present in STT-MRAMs and enable higher bit density and ultra-low power switching in advanced CMOS nodes.

VCMA switching may be realized by appropriately timing voltage pulses applied across the MTJ devices. When a voltage of a particular polarity is applied, due to the VCMA effect, the energy barrier $E_b$ between the two stable free layer magnetic states will be reduced. Once the applied voltage reaches a threshold value (e.g., a switching voltage $V_{sw}$), the energy barrier $E_b$ may be eliminated and the magnetic moment of the free layer may start to precess around an in-plane axis. The in-plane axis may be defined by a small external bias magnetic field. The in-plane axis may be alternatively defined by a built-in static magnetic field in appropriately designed MTJ devices. In one example, this static magnetic field may be provided by an additional in-plane fixed layer included within the MTJ stack. In another example, this additional in-plane fixed layer may be exchange biased by an antiferromagnetic layer to fix its direction of magnetization. By removing the voltage at the half-period point of the magnetic moment precession around the in-plane axis, the magnetization state of the free layer may end up in an opposite direction compared to the initial direction when the precession of the magnetic moment began. The switching voltage $V_{sw}$ may be expressed as Eq. 1:

$$V_{sw} = 4t_{MgO}E_b(V=0)/(\pi \xi D^2), \tag{1}$$

where $t_{MgO}$ is the thickness of the MgO layer, $E_b$ is the energy barrier between the free layer states, $\xi$ is the VCMA coefficient, and D is the diameter of the MTJ device.

Practical adoption of VCMA-MRAM may be facilitated by the MTJ device being configured to be switched at low voltages, which are compatible with the voltage levels of existing CMOS logic circuits. Thus, because $V_{sw}$ is inversely proportional to $\xi$, a sufficiently large VCMA coefficient may facilitate switching of nanoscale MTJs with a low write voltage. In contrast to the technology disclosed herein, previous work on VCMA-induced switching in MTJs utilized material stacks with relatively low VCMA values (e.g., about 30-50 fJ/Vm), resulting in high switching voltages (e.g., >2 V), and limiting the minimum MTJ diameters that could be switched to about 50 nm. While some works theoretically predicted and even experimentally demonstrated material structures with substantially higher VCMA values, none of these previously reported materials were implemented into precessional switching experiments on nanoscale MTJs. This has been due to the difficulty of simultaneously achieving all required MTJ parameters (in addition to high VCMA) in the same material stack, for example, the tunnel magnetoresistance (TMR) ratio (e.g., for facilitating electrical readout of the device state) and the perpendicular magnetic anisotropy (PMA), along with sufficient thermal tolerance (e.g., up to 400° C.) to withstand advanced CMOS back-end-of-line (BEOL) processing temperatures. In addition, some reports of large voltage-induced modulation of magnetic properties relied on magneto-ionic effects which, while large, generally do not function at the sub-nanosecond time scales of high-speed precessional switching.

Disclosed experimental measurements of the technology described herein demonstrate, for the first time, sub-1 V switching of nanoscale MTJs using VCMA, and demonstrate scaling of this switching mechanism down to MTJs with 30 nm diameter. This is achieved by a new voltage-controlled MTJ material stack, described herein, which simultaneously provides large VCMA (e.g., about 100 fJ/Vm), high TMR (e.g., >130% at film level), and thermal annealing stability at 400° C. Precessional VCMA switching experiments were performed on nanoscale perpendicular MTJs made of this new material stack described herein, with diameters ranging from about 30 nm to about 70 nm. Switching with higher than 90% probabilities in both directions was obtained on MTJs having diameters of about 50 nm and 70 nm with a voltage pulse amplitude of about 1 V, with a switching energy of about 11-15 fJ/bit. The switching voltage increased to about 2 V for the measured 30 nm diameter MTJs, which is comparable to the best previously reported values for much larger MTJs (e.g., >50 nm diameter). Also reported herein are ab initio electronic structure calculations of the VCMA effect in material stacks similar to those studied experimentally in this work, which shed light on the origins of the high VCMA and its effect on the observed transport characteristics. Overall, these results represent the lowest VCMA-induced switching voltage, the smallest VCMA-switched MTJ diameter, and the highest combination of VCMA and TMR in the same nanoscale MTJ device reported for MRAM elements to date.

FIG. 1A is a schematic diagram that illustrates an exemplary material stack 105 and structure of an exemplary magnetic tunnel junction (MTJ) 100. The MTJ material stack 105 may include a bottom electrode 110 upon which a plurality of film layers may be disposed (e.g., grown, deposited, formed, etched, etc. into a circular pillar as illustrated in FIG. 1A). A pinning layer 115 may be disposed on top of the bottom electrode 110 and electrically coupled (i.e., in electrical communication) therewith. The pinning layer 115 and/or the bottom electrode 110 may include a Co/Pt-based synthetic antiferromagnetic (SAF) multilayer. A CoFeB fixed layer 120 may be disposed on top of the pinning layer 115. In an example as described herein, the CoFeB fixed layer 120 may include elements Co, Fe, and B in proportions indicated by $Co_{20}Fe_{60}B_{20}$. In an example as described herein, the CoFeB fixed layer 120 may have a thickness of about 0.8 nm. A MgO layer 125 may be disposed on top of the CoFeB fixed layer 120. In an example as described herein, the MgO layer 125 may have a thickness of about 1.5 nm. A CoFeB free layer 130 may be disposed on top of the MgO layer 125. In an example as described herein, the CoFeB free layer 130 may include elements Co, Fe, and B in proportions indicated by $Co_{17.5}Fe_{52.5}B_{30}$. In an example as described herein, the CoFeB free layer 130 may have a thickness of about 1.6 nm. A Mo capping layer 135 may be disposed on top of the CoFeB free layer 130. In an example as described herein, the Mo capping layer 135 may have a thickness of about 5 nm. A top electrode 140 may be disposed on top of the Mo capping layer 135 and electrically coupled (i.e., in electrical communication) therewith. In the experimentally demonstrated examples described herein, a total thickness of the MTJ material stack 105, excluding its bottom electrode 110 and top electrode 140, was approximately 20 nm. In the experimentally demonstrated examples described herein, exemplary MTJ 100 devices were patterned into circular pillars with diameters of about 30 nm, 50 nm and 70 nm. Additional example MTJ 100 devices were having diameters ranging between about 30 nm and 50 nm and between about 50 nm and 70 nm were fabricated and experimentally demonstrated. More information about the sample preparation is given below with reference to FIGS. 6-7.

The use of Mo in the capping layer 135 was motivated by its better thermal annealing stability compared to alternative capping materials (notably, commonly used heavy metals such as Ta and Ir). This, in turn, is a consequence of the fact that Mo hardly bonds to Co or Fe, which may prevent its diffusion into the CoFeB free layer 130. In various exemplary MTJ 100 devices fabricated and experimentally measured, different CoFeB compositions were used in the top CoFeB free layer 130 and bottom CoFeB fixed layer 120, varying the B content while keeping the same 1:3 ratio between Co and Fe. The Boron concentration in the bottom CoFeB fixed layer 120 was chosen to be 20%, which has been shown to better promote the formation of (001) MgO texture, thus increasing the TMR. A higher B content of 30% was chosen for the top CoFeB free layer 130. This was motivated by the fact that the composition ratio of Fe and B in $Co_{17.5}Fe_{52.5}B_{30}$ is closer to that of body-centered tetragonal $Fe_2B$. Thus, as previously noted in the case of in-plane MTJs with large B content in the CoFeB, a short-range ordered structure close to that of $Fe_2B$ may form in the CoFeB free layer 130. This may induce a tensile strain on the MgO layer 125, which may have an effect upon the VCMA. Although the higher B content may result in reduced CoFeB crystallization and may be harmful for the TMR ratio, this may be effectively compensated in the B-rich top CoFeB free layer 130 due to the fact that we may use a higher annealing temperature in the fabrication of the MTJ 100 device, facilitated by the thermally stable Mo capping layer 135. In addition, the MgO texture of the MgO layer 125 (hence the associated TMR) may be more prominently affected by the bottom CoFeB fixed layer 120 preceding the MgO layer 125, which in our exemplary implementations and experimental demonstrations disclosed herein may include only 20% Boron.

Figure 1B:
FIG. 1B is an exemplary graph illustrating exemplary measured MTJ device resistance R as a function of perpendicular magnetic field Hoop for an exemplary 70 nm diameter MTJ device measured under different DC bias voltages.

FIG. 1B is an exemplary graph 150 illustrating exemplary measured MTJ 100 device resistance R as a function of perpendicular magnetic field $H_{oop}$ for an exemplary 70 nm diameter MTJ 100 device measured under different DC bias voltages. In general, an external magnetic field H may be applied at an angle $\theta_H$ from the film normal 145, as shown in FIG. 1A. The magnetic field is perpendicular when $\theta_H=0$. $H_{oop}$ denotes the out-of-plane magnetic field. In the following measurements disclosed herein, the positive voltage is defined as the voltage being applied to the top electrode 140 relative to the bottom electrode 110, as shown in FIG. 1A. The measurements shown in graph 150 were performed at DC bias voltages of −1 V, 0.001 V, and 1 V. The illustrated measurements show different levels of hysteresis in the value of device resistance R as a function of $H_{oop}$ for different DC bias voltages.

The low and high resistance levels shown in graph 150 correspond to the parallel (P) and antiparallel (AP) magnetization configurations of the two CoFeB layers (120, 130), respectively. Since the magnetization of the bottom CoFeB (fixed reference) layer 120 is fixed by the pinning layer 115, only the magnetization of the top CoFeB (free) layer 130 may be switched. The TMR ratio, which is defined as $(R_{AP}-R_P)/R_P$, shows a value of about 175% in the loop measured at near zero (i.e., 1 mV) voltage bias. Negative 1 V bias voltages are observed to decrease the coercivity of the CoFeB free layer 130, and positive 1 V bias voltages are observed to increase the coercivity of the CoFeB free layer 130, which confirm the existence of VCMA. A small offset field of approximately −50 Oe can be observed, which may be due to the imperfect cancellation of the stray magnetic field from the SAF and reference layers.

Electric-field-induced precessional switching measurements were performed on the exemplary patterned MTJ 100 devices, using voltage pulses having different amplitudes and widths. A constant tilted magnetic field was applied at an angle $\theta_H$ from the film normal 145 during measurements, to (i) compensate the offset (i.e., stray) field, (ii) define an in-plane axis for the precession, and (iii) adjust the energy barrier $E_b$ of different-sized MTJ 100 devices to a similar value for fair comparison of their switching behavior. The switching probability was obtained by measuring the MTJ 100 device resistance after each voltage pulse application.

Figure 2:
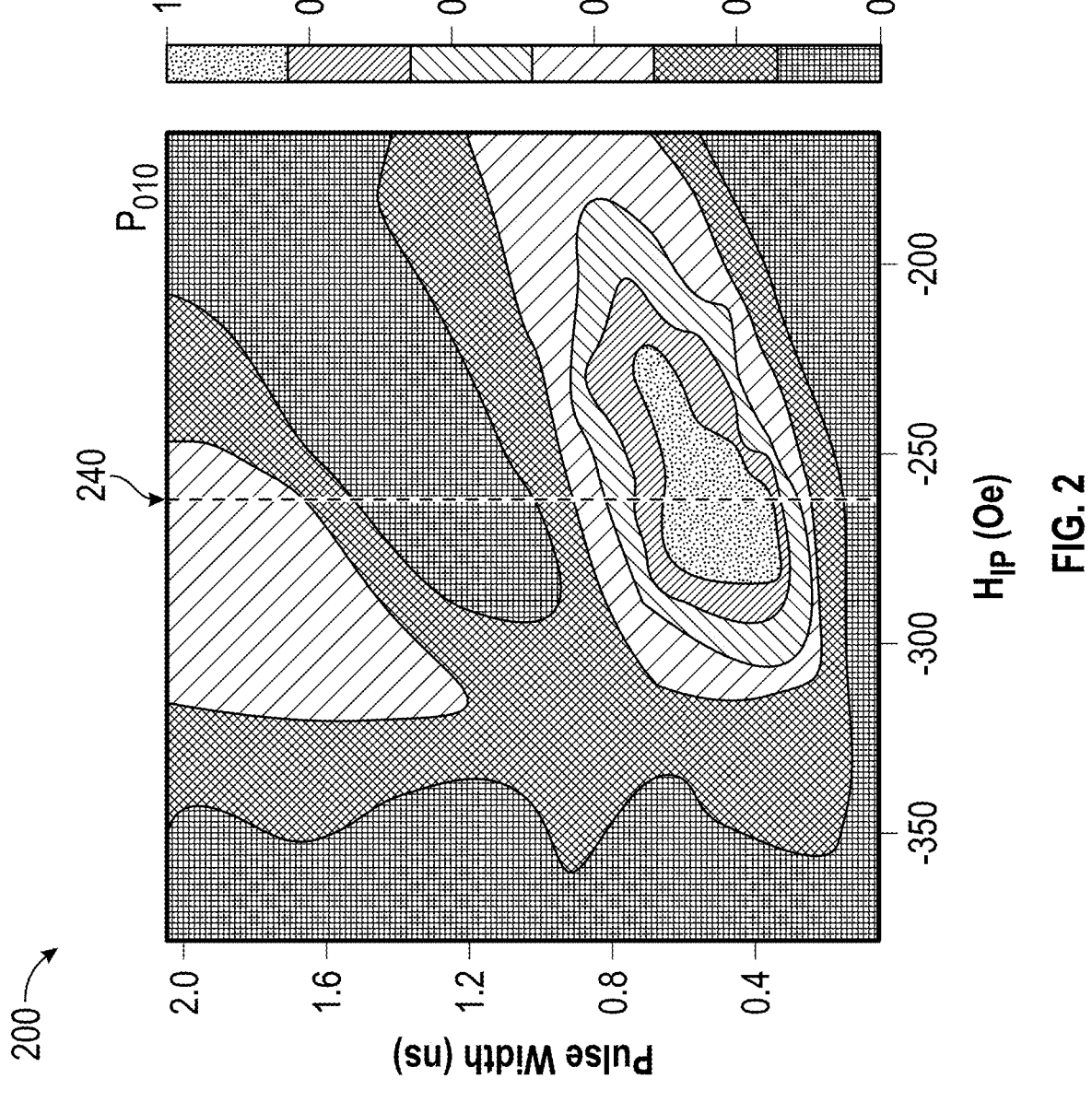
FIG. 2 is an exemplary heat graph showing exemplary measured switching probability of successive back and forth switching ($P_{010}$).
Figure 3A:
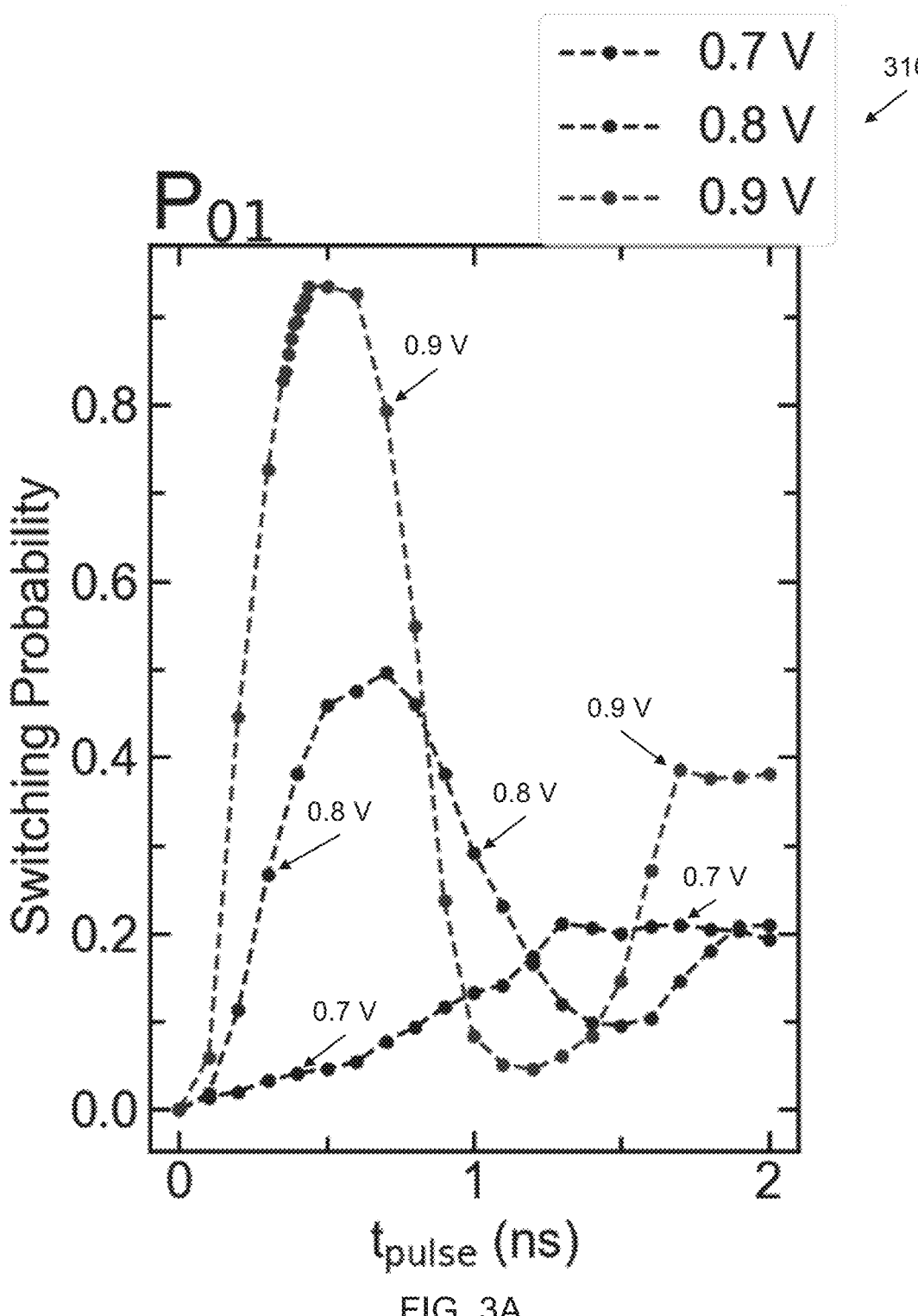
FIG. 3A is an exemplary graph showing exemplary measured switching probabilities from a P state to an AP state ($P_{01}$) as a function of pulse duration for different pulse voltage values.
Figure 3B:
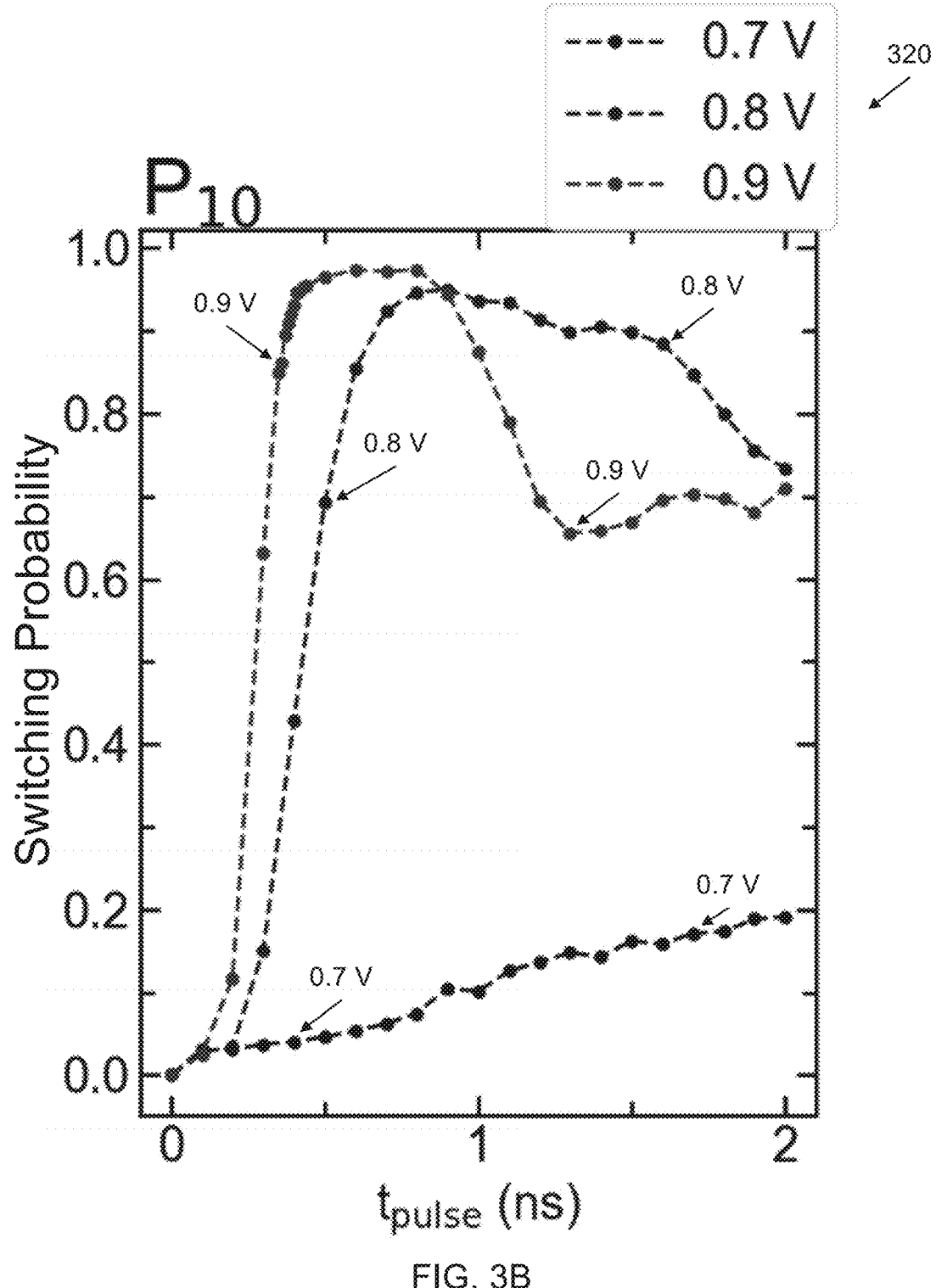
FIG. 3B is an exemplary graph showing exemplary measured switching probabilities from an AP state to a P state ($P_{10}$) as a function of pulse duration for different pulse voltage values.
Figure 3C:
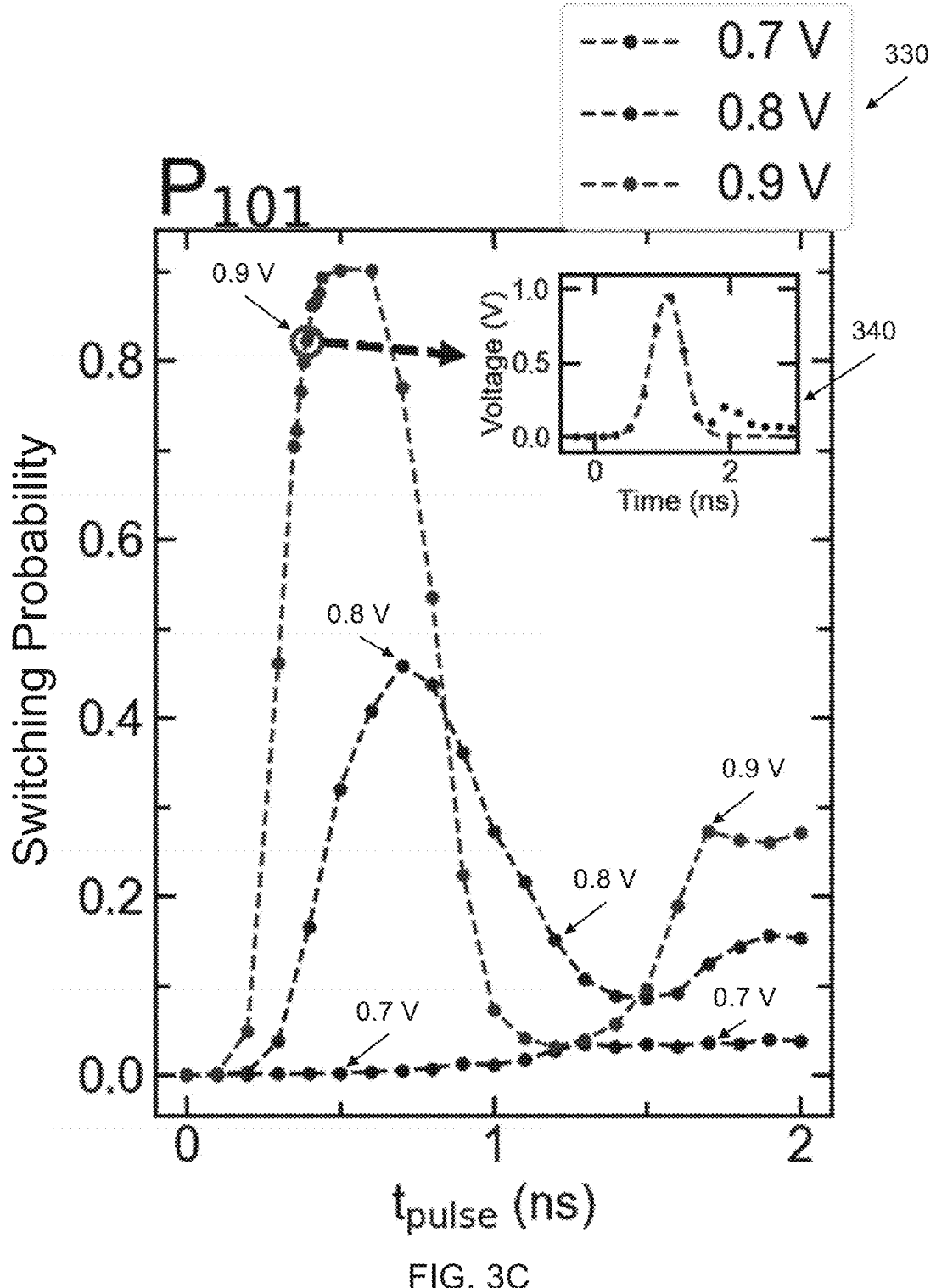
FIG. 3C is an exemplary heat graph showing exemplary measured switching probabilities from back and forth switching ($P_{101}$) as a function of pulse duration for different pulse voltage values.

FIG. 2 is an exemplary heat graph 200 showing exemplary measured switching probability of successive back and forth switching (i.e., two successful consecutive switching attempts from P state to AP state and back to P state, noted as $P_{010}$) for a 0.9 V nominal voltage pulse under different pulse widths and in-plane magnetic fields applied to an exemplary 70 nm diameter MTJ 100 device. The measurement results shown in the graph 200 were obtained using 1000 switching attempts with identical voltage pulses, each having the nominal amplitude of 0.9 V, for various pulse widths and external fields. An in-plane magnetic field 240 was used for the subsequent switching probability measurements as a function of voltage pulse amplitude and width, as shown in FIGS. 3A-3C. Measured switching probability data on other exemplary MTJ 100 devices having different diameters were in general agreement with those included in graph 200. See FIGS. 10A-10C, 11A-11C, and accompanying descriptions herein.

It should be noted that actual experimental pulse amplitude across the MTJ 100 device may be higher than the nominal value, due to reflection resulting from impendence mismatch between the MTJ 100 devices and 50Ω transmission lines carrying the voltage pulse to the MTJ 100 devices. As a result, the voltage across the MTJ 100 device may in experimental practice be $V=(1+\Gamma')V_{nominal}$, where $\Gamma'$ is the voltage reflection coefficient and $\Gamma'\approx1$ when the MTJ 100 device impedance is much larger than 50Ω. Thus, in principle, for long enough square-shaped pulses, the actual voltage across the MTJ 100 device may be $V\approx2V_{nominal}$. However, due to the finite rise time of the pulse generator used in the experimental measurements described herein, short (e.g., sub-ns) pulses were observed to be nearly triangular in shape and thus the actual amplitude on the MTJ 100 devices was significantly smaller than $2V_{nominal}$. To accurately determine its value, the actual pulse shapes were measured using an oscilloscope with a 1 MΩ input impendence, representing a reflection coefficient $\Gamma'\approx1$, similar to the MTJ 100 device case.

FIG. 3A is an exemplary graph 310 showing exemplary measured switching probabilities from a P state to an AP state ($P_{01}$) as a function of pulse duration for different pulse voltage values. FIG. 3B is an exemplary graph 320 showing exemplary measured switching probabilities from a AP state to a P state ($P_{10}$) as a function of pulse duration for different pulse voltage values. FIG. 3C is an exemplary graph 330 showing exemplary measured switching probabilities from back and forth switching ($P_{101}$) as a function of pulse duration for different pulse voltage values. The inset 340 in FIG. 3C shows the measured shape of the exemplary pulse with 0.9 V nominal amplitude and 0.4 ns width, which gives >90% switching probability in both directions. The dots in inset 340 are measured values determined by measurements made using an oscilloscope having a 1 MΩ impedance, while the dashed line in inset 340 is a Gaussian fit to the data.

The graphs 310, 320, and 330 show the exemplary switching probabilities of P to AP ($P_{01}$), AP to P ($P_{10}$), and consecutive back and forth switching ($P_{010}$), respectively, for the same measured exemplary 70 nm MTJ 100 device with the fixed external field illustrated in FIG. 2 under different nominal voltage amplitudes, as a function of the write pulse duration. The switching probabilities were calculated in the same way as the exemplary case shown in FIG. 2, from 10000 write attempts for each pulse amplitude and duration. Oscillations of the switching probability as a function of pulse width were observed for voltages over 0.8 V, indicating the electric-field induced precessional switching. Switching with >90% probabilities in both directions (e.g., $P_{01}$>90%, $P_{10}$>90%, $P_{010}$>81%) was achieved with pulses configured to have a 0.9 V nominal amplitude and 0.4 ns pulse duration. The real shape of the voltage pulse at this point, recorded using the oscilloscope, is shown in the inset 340, showing a maximum amplitude of $V_{sw}$=0.95 V. This value of $V_{sw}$ is 2× lower than the best previously reported values for precessional VCMA switching in MTJ devices. Energy dissipation during the switching was calculated using the fitted Gaussian function, and is given by Eq. 2:

$$E=\int P dt=\int (V^2/R)dt \qquad (2)$$

where the resistance was chosen as R $(R_P+R_{AP})/2$ under −1 V DC bias, as shown in FIG. 1B, to obtain the average energy for the two switching directions. Computing Eq. 2 for this exemplary case results in a value for E=15.1 fJ/bit. The same measurements, repeated on different exemplary MTJ 100 devices having different sizes on the same wafer gave results of $V_{sw}$=1.05 V, E=11.2 fJ/bit for 50 nm diameter MTJ 100 devices; and $V_{sw}$=2 V, E=17.6 fJ/bit for 30 nm diameter MTJ 100 devices. See FIGS. 10A-10C, 11A-11C and accompanying descriptions herein. The energy consumption per write according to the exemplary measurements is comparable to the best previously reported values for VCMA switching. Energy consumption per write may be further reduced by designing MTJ stacks with a higher resistance-area (RA) product.

Figure 4A:
FIG. 4A is an exemplary graph that shows exemplary measurements of real-time voltage for near-zero bias across an exemplary 70 nm diameter MTJ device, under the same applied field used for the exemplary switching measurements shown in FIGS. 3A, 3B, and 3C.
Figure 4B:
FIG. 4B is an exemplary graph that shows an exemplary distribution for P state dwell times for the same exemplary 70 nm diameter MTJ device.
Figure 4C:
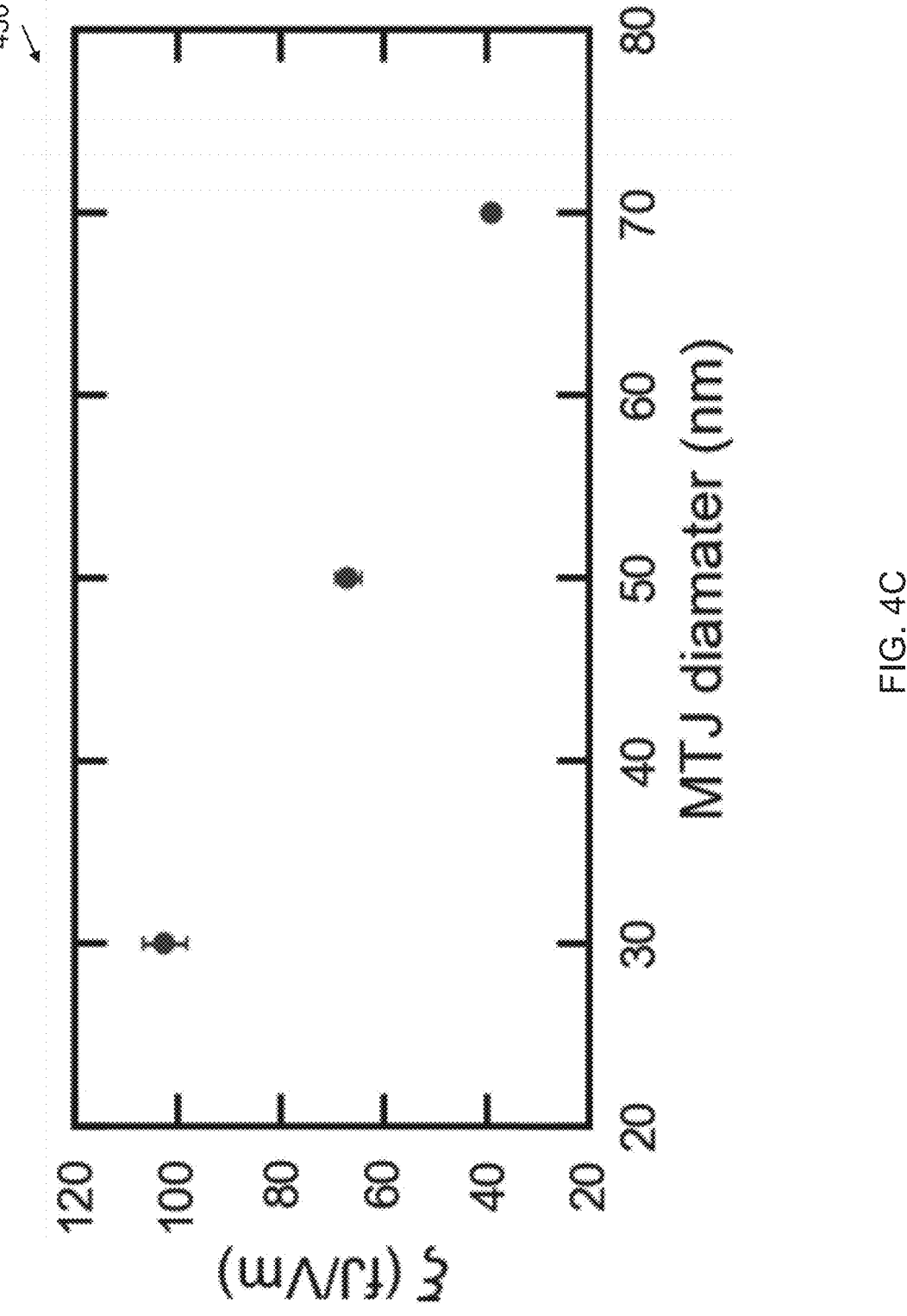
FIG. 4C is an exemplary graph that shows exemplary VCMA coefficients obtained from measured switching voltages for exemplary MTJ devices with different diameters.

FIG. 4A is an exemplary graph 410 that shows exemplary measurements of real-time voltage for near-zero bias across an exemplary 70 nm diameter MTJ 100 device, under the same applied field used for the exemplary switching measurements shown in graphs 310, 320, and 330. FIG. 4B is an exemplary graph 420 that shows an exemplary distribution for P state dwell times for the same exemplary 70 nm diameter MTJ 100 device. FIG. 4C is an exemplary graph 430 that shows exemplary VCMA coefficients obtained from measured switching voltages for exemplary MTJ 100 devices with different diameters.

To obtain the results shown in the exemplary graphs 410, 420, and 430, VCMA coefficients were extracted for the measured exemplary MTJ 100 devices with different diameters from the switching measurement results. This was done by first calculating the energy barrier $E_b$ of the free layer 130 under near-zero voltage bias, $E_b(V=0)$, by measuring the mean time for thermally activated switching (i.e., the dwell time). The measurement was performed under the same applied external magnetic field as in the switching measurements described above. The dwell time was determined from a total of about 300 switching events, by monitoring the real-time voltage across the exemplary MTJ 100 device using an oscilloscope. Results from an exemplary 70 nm diameter MTJ 100 device are shown in the graphs 410 and 420. The energy barrier $E_b$ was calculated from Eq. 3:

$$\tau = \tau_0 \exp(E_b/k_bT), \tag{3}$$

where $\tau$ is the measured dwell time, zo is the attempt time (assumed to be 1 ns), $k_b$ is the Boltzmann constant, and T is temperature. Calculations from the P state distribution gave a dwell time of $\tau_P=19.2$ s, as shown in graph 420, resulting in an energy barrier of $E_b$(V=0)=23.7 $k_b$T. The same calculation performed from the AP state distribution gave $E_b$(V=0)=22.7 $k_b$T. The small asymmetry in these results may be attributed to the finite remaining stary field from the fixed layer 130. Thus, the energy barrier under zero bias was estimated as $E_b$(V=0)=23.2±0.5 $k_b$T. Similarly, the energy barriers for the 30 nm and 50 nm diameter exemplary MTJ 100 devices described herein were measured to be 23.5±0.5 $k_b$T and 22.4±0.8 $k_b$T, respectively. As mentioned above, the similar energy barrier for devices of different sizes was achieved by adjusting the in-plane external field, to allow a fair comparison of their switching voltages.

Independently, the energy barrier may be calculated as the product of an effective anisotropy energy density $K_{eff}$ and the free layer volume V, where:

$$V=(t_{CoFeB}D^2\pi)/4, \tag{4}$$

and $$K_{eff}=K_i/t_{CoFeB}-2\pi M_s^2. \tag{5}$$

Here, $t_{CoFeB}$ is the free layer thickness, $K_i$ is the interfacial anisotropy energy density, and $M_S$ is the saturation magnetization. Assuming a linear dependence of the interfacial anisotropy energy density on voltage, we have:

$$K_i(V)=\xi V/t_{MgO}+K_i(V=0). \tag{6}$$

Combining the above Eqs. 4, 5, and 6, the voltage-dependent energy barrier may then be written as Eq. 7:

$$\frac{E_b(V)}{D^2} = \xi \frac{\pi}{4t_{MgO}} V + \frac{E_b(V=0)}{D^2}. \tag{7}$$

At the threshold voltage for precessional reversal, the energy barrier becomes zero, i.e., $E_b$ ($V_{sw}$)=0. The VCMA coefficient may thus be derived from Eq. (7) using the $E_b$ (V=0) values measured above for exemplary MTJ 100 devices with different diameters. The dots illustrated in graph 430 show the VCMA coefficients for exemplary MTJ 100 devices with different diameters, obtained using this method. The values calculated for 30 nm, 50 nm and 70 nm diameter MTJ 100 devices were 102 fJ/Vm, 67 fJ/Vm and 39 fJ/Vm, respectively.

The VCMA coefficients extracted from the precessional switching experiments decrease noticeably with increasing MTJ diameter. This may be attributed to the role of sub-volume nucleation in determining the energy barrier of MTJ devices with larger diameters, which has been shown in previous works to result in an underestimation of the VCMA coefficient obtained from pulsed switching measurements for large MTJ devices. Specifically, in free layers with larger diameters (typically >40 nm), the thermally-activated switching (which was used here to determine the dwell time)

may no longer be realized as a single-domain reorientation, since there may be more energetically favorable paths for the magnetization to reverse through the formation of a non-uniform micromagnetic configuration. Hence, the effective free layer diameter which determines $E_b$ may be smaller than its real value (e.g., 50 nm or 70 nm). Since this effect is not accounted for in Eq. (7), using this expression to estimate the VCMA value for our exemplary 50 nm and 70 nm diameter devices may result in a lower (e.g., underestimated) VCMA coefficient. Based on this, we may conclude that the VCMA of about 100 fJ/Vm obtained from our smallest devices (e.g., with 30 nm diameter) is the most reliable estimate of the VCMA value in the films described herein. As discussed below, this conclusion is also consistent with a comparison of the switching voltage measurement results of the technology described herein to previous works with lower VCMA values.

Specifically, it is worth comparing the switching results of the technology described herein with those from a previous work, where a switching voltage of 1.96 V was achieved on a 50 nm diameter MTJ with a VCMA coefficient of $\xi=32$ fJ/Vm and an energy barrier similar to that of this technology described herein (i.e., about 23 kbT). Based on Eq. (7), the switching voltage may be expressed as $V_{sw}=4t_{MgO}E_b$ (V=0)/($\pi\xi D^2$). Comparing these data to the switching results from exemplary 30 nm diameter MTJ 100 devices in the present work, we note that given the same $t_{MgO}$ and $E_b$(V=0), the switching voltage should be inversely proportional to $\xi D^2$. Thus, for the exemplary D=30 nm MTJ 100 devices with $\xi=102$ fJ/Vm, one would expect the switching voltage to be approximately 1.7 V, which is in good agreement with the experimental value obtained from the measured exemplary 30 nm diameter MTJ 100 devices. See FIGS. 10A-10C, 11A-11C, and accompanying descriptions herein.

To further understand the effect of Mo capping on the PMA and VCMA, ab initio electronic structure calculations were carried out in an exemplary Mo/CoFe/MgO hetero-structure. The slab supercell for the exemplary Mo/CoFe/MgO (001) junction consisted of three Mo monolayers (MLs) on top of three MLs of $B_2$-type CoFe, sandwiched between seven MLs of rocksalt MgO and a 15-Å-thick vacuum region. The O atoms at the CoFe/MgO interface were placed atop the Fe atoms, which is the most stable configuration. $Fe_1$ and $Fe_2$ denote the atoms at the Fe/MgO and Fe/Mo interfaces, respectively.

Figure 5A:
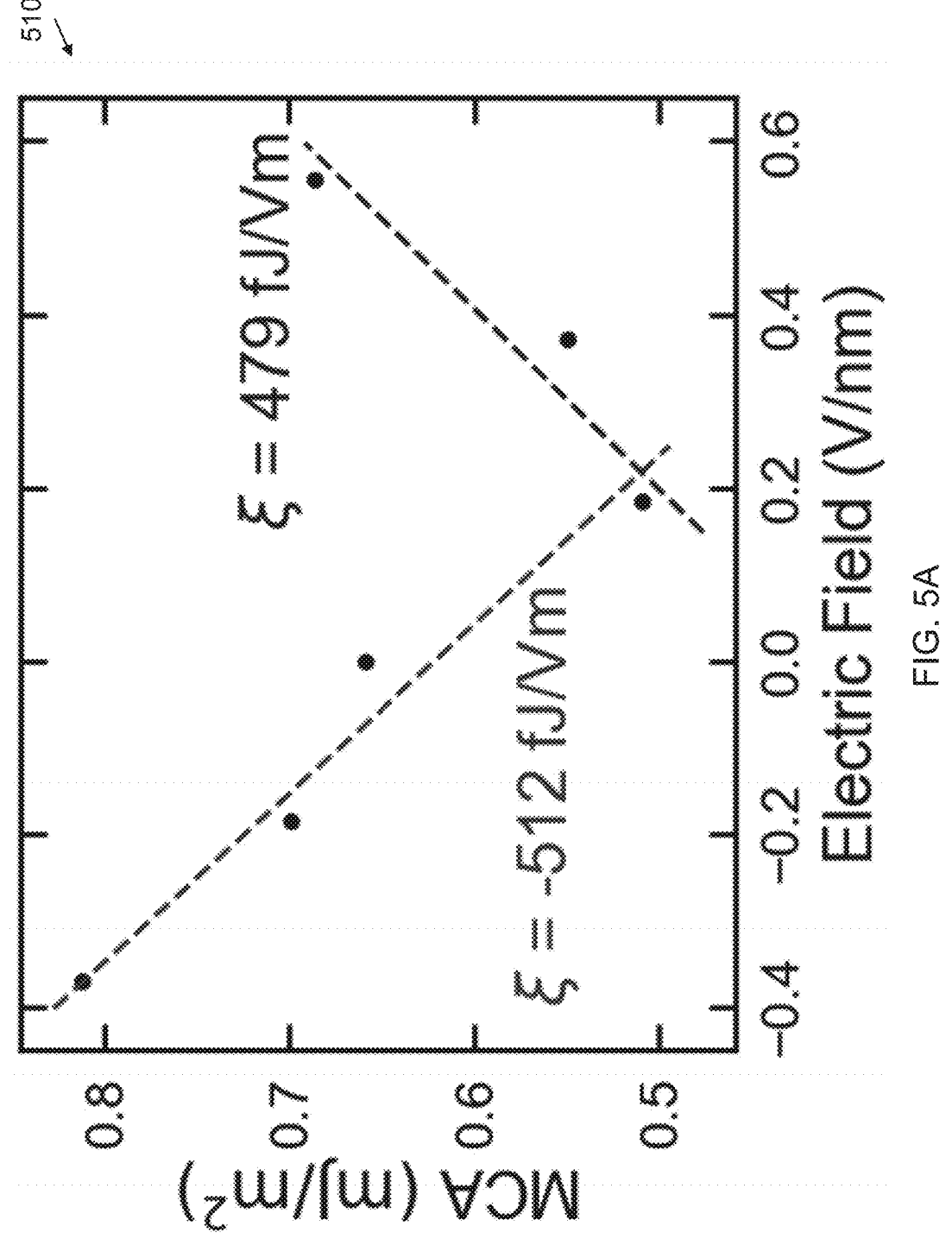
FIG. 5A is an exemplary graph that illustrates magnetic anisotropy as a function of electric field in MgO for the exemplary Mo/FeCo/MgO junction.
Figure 5B:
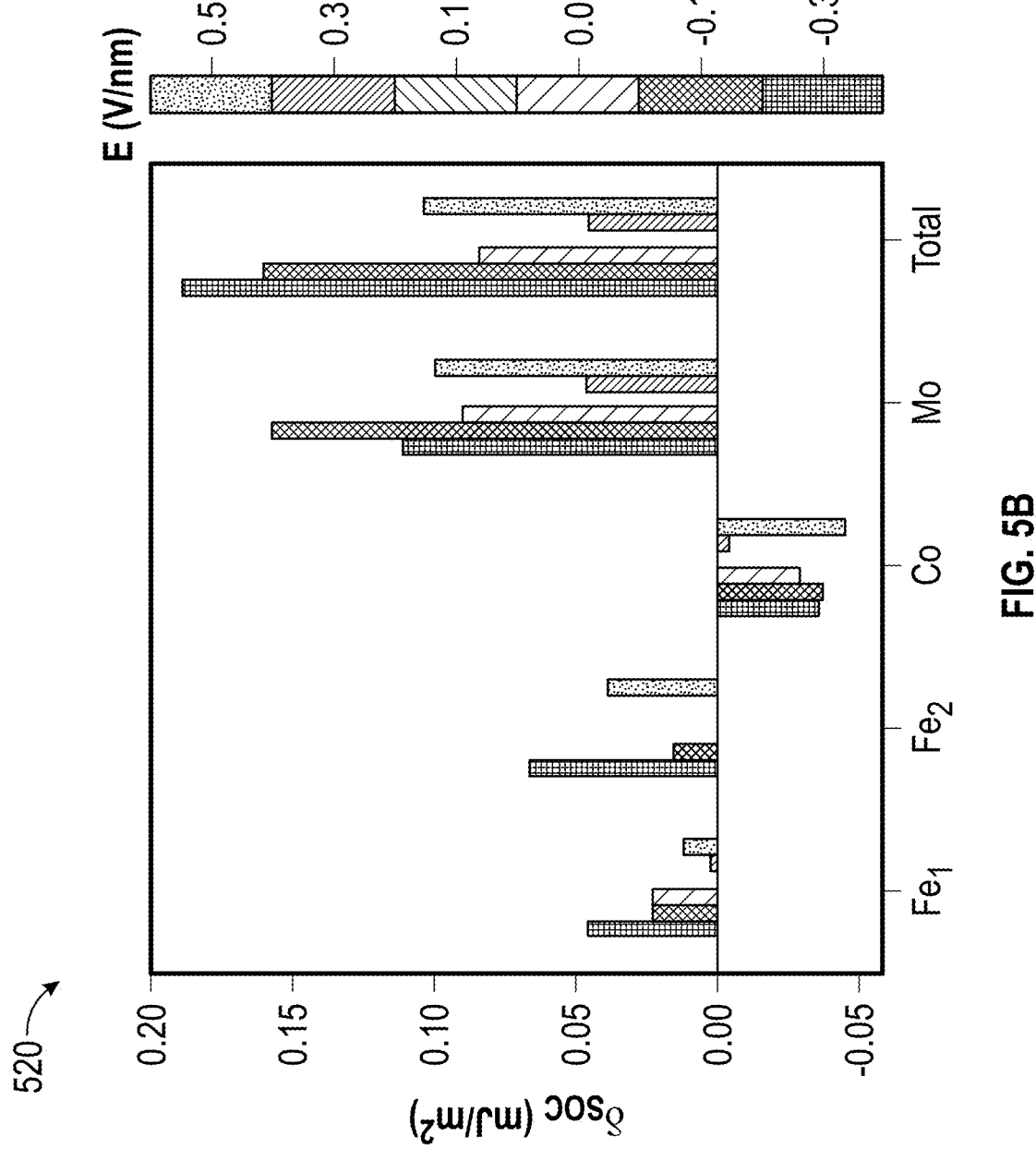
FIG. 5B is an exemplary graph that illustrates the E-field-induced change of SOC energy difference ($\delta$SOC).

FIG. 5A is an exemplary graph 510 that illustrates magnetic anisotropy as a function of electric field in MgO for the exemplary Mo/FeCo/MgO junction. FIG. 5B is an exemplary graph 520 that illustrates the E-field-induced change of SOC energy difference ($\delta_{SOC}$) for the exemplary Mo/FeCo/MgO junction. The atom-resolved $\delta_{SOC}$ is also shown.

The exemplary $Fe_1$, $Fe_2$, and Co magnetic moments were 2.683, 2.146, and 1.769$\mu_B$, respectively. Induced magnetization was also found in the capped Mo MLs because of the proximity effect, where the interfacial Mo ML acquires a spin moment of −0.180$\mu_B$. The variation of the magneto-crystalline anisotropy (MCA) as a function of the electric field in MgO is shown in graph 510, which exhibits an asymmetric (shifted) V-shape with giant $\xi$ values of +479 and −512 fJ/Vm, and a minimum near 0.2 V/nm. The underlying origin of the shifted V-shape may arise from the fact that the interface bands depend on the magnetization direction due to the Rashba effect. The Rashba coupling, which is proportional to the net electric field, $E_z$, at the interface, has contributions from both the internal and external electric fields. The critical field where the MCA reaches its maximum or minimum value may depend on the interplay between the two electric fields, where the internal electric field may be tuned via strain and/or disorder. Thus, this critical electric field may depend sensitively on the biaxial strain which is ubiquitous in heavy metal/ferromagnet/insulator tunnel junctions, and as noted before, may be further affected by the presence of remaining B atoms within the free layer after annealing. Further simulations showed that a small change in the in-plane lattice constant of CoFe (0.5%) may shift the critical electric field by several tenths of V/nm, and from negative to positive. Furthermore, disorder at the CoFe/MgO and Mo/CoFe interfaces may change both the value of ξ and the critical electric field where the MCA reaches its minimum. Thus, we hypothesize that in experiments, the real lattice constant may shift the minimum point out of the range of the experimentally accessible electric fields, resulting in an apparently monotonic dependence.

In order to understand the underlying mechanism of both the MCA and VCMA behavior, we calculated the difference in spin orbit coupling (SOC) energies between the in- ($\parallel$) and out-of-plane ($\perp$) magnetization orientations, $$\Delta E_{SOC} = \left(E_{SOC}^{\parallel} - E_{SOC}^{\perp}\right).$$

We find that the MCA$\approx\Delta E_{SOC}$ due to the relatively small SOC of Mo. Graph 520 shows the layer-resolved and total electric-field-induced change of $\Delta E_{SOC}$, $\delta_{SOC}=\Delta E_{SOC}(\vec{E})-\Delta E_{SOC}(\vec{E}_c)$, where $\vec{E}_c$ is the critical electric field. The layer-resolved $\delta_{SOC}$ for $\vec{E}>\vec{E}_c$ and $\vec{E}<\vec{E}_c$ is consistent with the trend of the electric field variation of MCA in graph 520, indicating that the largest contribution to electric field-induced change of $\Delta E_{SOC}$ arises from the interfacial Mo layer.

The exemplary 1.6 nm-thick CoFeB free layers 130 for all the exemplary MTJ 100 devices used in the work described herein were taken from a wedged film where the CoFeB thickness was varied across the wafer. The exemplary film stacks 105 were sputter deposited in an ultrahigh vacuum (UHV) physical vapor deposition (PVD) system, annealed at wafer level for about 30 minutes at 400° C., and then fabricated into circular pillars with diameters of about 30 nm, 50 nm and 70 nm using electron beam lithography. The MgO layers 125 were deposited by radio-frequency (RF) sputtering, while metallic layers were deposited by DC sputtering. Electrical measurements were performed on a probe station with a projected field electromagnet, using microwave probes with a ground-signal-ground (GSG) configuration. The voltage pulses for the switching measurement were applied with a Tektronix pulse generator (PSPL10070A), and the resistance after each pulse was measured by a sourcemeter (Keithley 2401) using a bias tee.

The first-principles calculations were carried out within the projector augmented-wave method, as implemented in the Vienna ab initio simulation package (VASP). The generalized gradient approximation was used to describe the exchange-correlation functional as parametrized by Perdew, Burke, and Ernzerhof (PBE). The in-plane lattice constant was set to be 2.86 Å. An energy cutoff of 500 eV and a 16×16×1 k-point mesh were used to relax the atomic coordinates for each electric field until the largest force became less than $5\times10^{-3}$ eV/A, and the change in the total energy between two ionic relaxation steps was smaller than $10^{-6}$ eV. The dipole corrections were taken into account along the

[001] direction. The SOC of the valence electrons was in turn included using the second-variation method employing the scalar-relativistic eigenfunctions of the valence states and a 32×32×1 k-point mesh. The MCA energy per unit interfacial area, A, was then determined from ($E_{[100]}-E_{[001]}$)/A, where $E_{[100]}$ and $E_{[001]}$ are the total energies with magnetization along the [100] and [001] directions, respectively. The voltage-controlled magnetic anisotropy was calculated as $\Delta(MCA)=\xi E_f=(E_{ext}/\varepsilon$, where $\varepsilon$ is the dielectric constant of the insulator which depends on strain, and $E_{ext}$ is the external electric field.

FIG. 6 is a flowchart that illustrates an exemplary process 600 of fabricating a voltage-controlled magnetic anisotropy (VCMA) magnetic tunnel junction (MTJ) device. In some examples, one or more blocks of FIG. 6 may be performed by semiconductor fabrication equipment, for example, a physical vapor deposition (PVD) device, a heating device, and/or an electron beam lithography device.

As shown in FIG. 6, process 600 may include forming a plurality of layers in a perpendicularly rising sequence above a bottom electrode 110, the plurality of layers having a bottom CoFeB fixed layer 120 in electrical communication with the bottom electrode 110, a MgO layer 125, a top CoFeB free layer 130, and a Mo capping layer 135 (block 602). For example, a physical vapor deposition (PVD) device may form a plurality of layers in a perpendicularly rising sequence above a bottom electrode 110, the plurality of layers having a pinning layer 115, a bottom CoFeB fixed layer 120 in electrical communication with the bottom electrode 110 via the pinning layer 115, a MgO layer 125, a top CoFeB free layer 130, and a Mo capping layer 135, as described above. As also shown in FIG. 6, process 600 may include performing thermal annealing (block 604). For example, a heating device may perform thermal annealing on the plurality of layers, as described above. As further shown in FIG. 6, process 600 may include patterning the plurality of layers into a circular pillar (block 606). For example, an electron beam lithography device may pattern the plurality of layers into a circular pillar, as described above.

Process 600 may include additional examples, such as any single example or any combination of examples described below and/or in connection with one or more other processes described elsewhere herein. In a first example, the plurality of layers further may include a pinning layer 115 having a Co/Pt-based synthetic antiferromagnetic (SAF) multilayer between the bottom electrode 110 and the bottom CoFeB fixed layer 120.

In a second example, alone or in combination with the first example, process 600 may include forming a top electrode 140 above and in electrical communication with the Mo capping layer 135.

In a third example, alone or in combination with the first and/or second examples, forming the plurality of layers may include sputter depositing using physical vapor deposition.

In a fourth example, alone or in combination with one or more of the first through third examples, the circular pillar is patterned with a diameter within a range of about 30 nm to about 50 nm.

In a fifth example, alone or in combination with one or more of the first through fourth examples, the circular pillar is patterned with a diameter within a range of about 50 nm to about 70 nm.

In a sixth example, alone or in combination with one or more of the first through fifth examples, the circular pillar is patterned using electron beam lithography.

In a seventh example, alone or in combination with one or more of the first through sixth examples, the MgO layer 125 is deposited by radio-frequency (RF) sputtering.

In an eighth example, alone or in combination with one or more of the first through seventh examples, layers having metallic compounds are deposited by DC sputtering.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figures 7A, 7B:
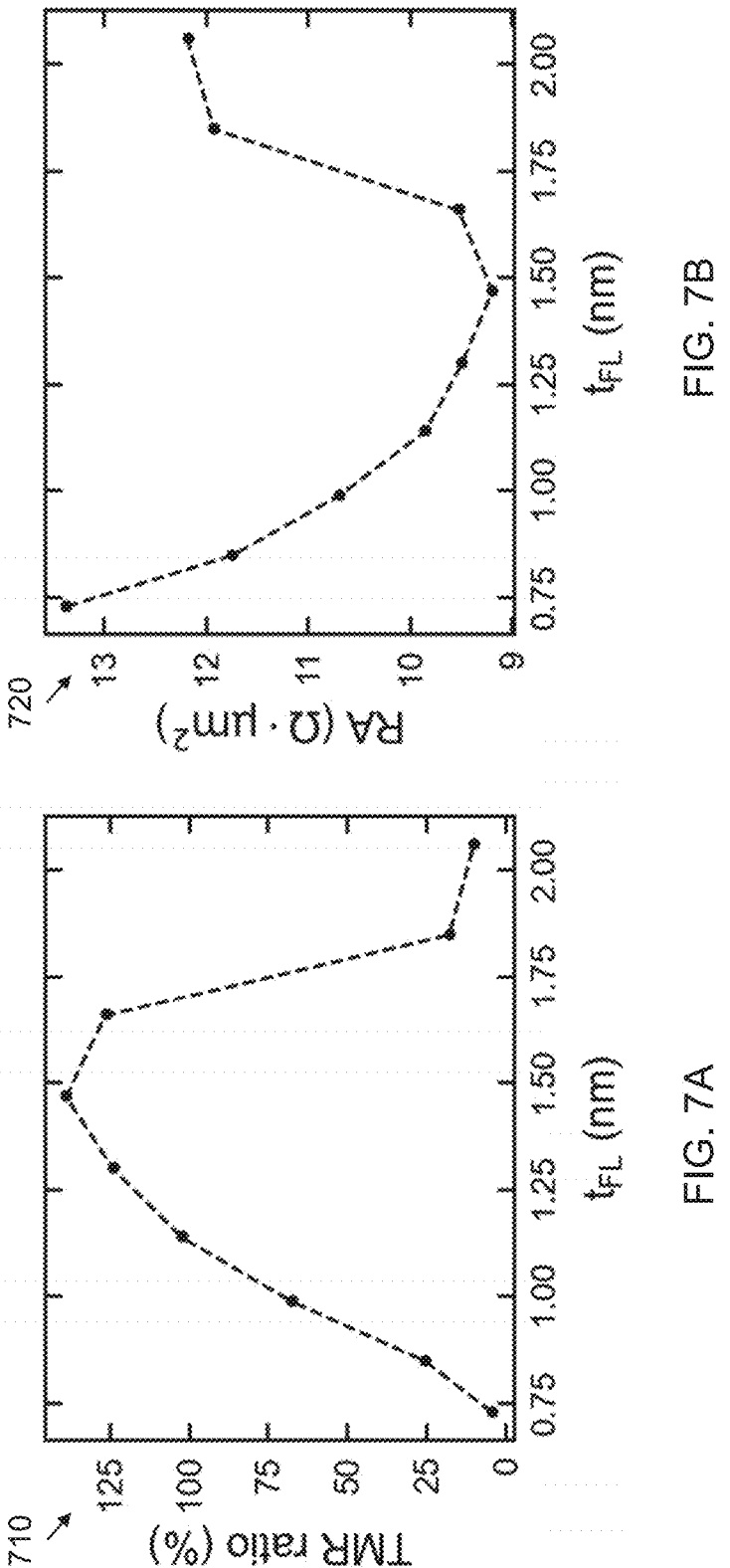
FIG. 7A is an exemplary graph that shows a plot of film-level experimentally measured TMR ratio as a function of free layer thickness ($t_{FL}$) across the fabricated wafer.
FIG. 7B is an exemplary graph that shows a plot of film-level experimentally measured RA value as a function of free layer thickness ($t_{FL}$) across the fabricated wafer.

FIG. 7A is an exemplary graph 710 that shows a plot of film-level experimentally measured TMR ratio as a function of free layer thickness ($t_{FL}$) across the fabricated wafer. FIG. 7B is an exemplary graph 720 that shows a plot of film-level experimentally measured RA value as a function of free layer thickness ($t_{FL}$) across the fabricated wafer. The thickness of the free layer (e.g., CoFeB free layer 130) for the devices used in the switching measurements in this work was 1.6 nm, while the MgO (e.g., MgO layer 125) thickness was slightly increased to result in a higher resistance-area (RA) product of about 80Ω·μm².

Film-level characterization of the tunneling magnetoresistance (TMR) ratio and resistance-area (RA) product was performed before the device fabrication, using the current in-plane tunneling (CIPT) technique. Results at different locations on the wafer having different free layer thicknesses are shown in FIGS. 7A and 7B. The thickness of the free layer (e.g., CoFeB free layer 130) for the devices (e.g., MTJ 100) used in this work was 1.6 nm. The sharp drop of the TMR for free layer thickness above about 1.7 nm may occur due to the transition from perpendicular to in-plane anisotropy. Note that the exemplary devices (e.g., MTJ 100) reported herein had a slightly increased MgO (e.g., MgO layer 125) thickness, resulting in a higher nominal RA product of about 80Ω·μm².

FIG. 8 is a flowchart that illustrates an exemplary process 800 of switching a free-layer magnetization state of a voltage-controlled magnetic anisotropy (VCMA) magnetic tunnel junction (MTJ) device (e.g., MTJ 100). In some examples, one or more process blocks of FIG. 8 may be performed by a computing device. In some examples, one or more process blocks of FIG. 8 may be performed by an electronic circuit.

As shown in FIG. 8, process 800 may include applying a magnetic field H across the top CoFeB free layer 130 of the MTJ 100 device along an axis (block 802). For example, an electronic circuit may apply a magnetic field H across the top CoFeB free layer 130 of the MTJ 100 device along an axis, as described above. As also shown in FIG. 8, process 800 may include applying a switching voltage Vsw between the top electrode 140 and the bottom electrode 110 of the MTJ 100 device, where Vsw=4tMgOEbV=0/(πξD2), tMgO is a thickness of the MgO layer 125, Eb is an energy barrier between two free-layer magnetization states, ξ is a VCMA coefficient, and D is a diameter of the MTJ 100 device (block 804). For example, an electronic circuit may apply a switching voltage Vsw between the top electrode 140 and the bottom electrode 110 of the MTJ 100 device, where Vsw=4tMgOEbV=0/(πξD2), tMgO is a thickness of the MgO layer 125, Eb is an energy barrier between two free-layer magnetization states, ξ is a VCMA coefficient, and D is a diameter of the MTJ 100 device, as described above. As further shown in FIG. 8, process 800 may include removing the switching voltage Vsw after the switching voltage Vsw has been applied for a switching time $t_{sw}$ corresponding to a half period of a magnetic moment precession of the top CoFeB free layer 130 (block 806). For example, an electronic circuit may remove the switching voltage Vsw after the switching voltage Vsw has been applied for a switching time tsw corresponding to a half period of a magnetic moment precession of the top CoFeB free layer 130, as described above.

Process 800 may include additional examples, such as any single example or any combination of examples described below and/or in connection with one or more other processes described elsewhere herein. In a first example, the axis, along which the magnetic field H is applied, is offset by an angle $\theta_H$ from normal to a plane of the plurality of layers of the MTJ 100 device.

Although FIG. 8 shows example blocks of process 800, in some examples, process 800 may include additional blocks, fewer blocks, different blocks, or differently arranged blocks than those depicted in FIG. 8. Additionally, or alternatively, two or more of the blocks of process 800 may be performed in parallel.

Figure 9A:
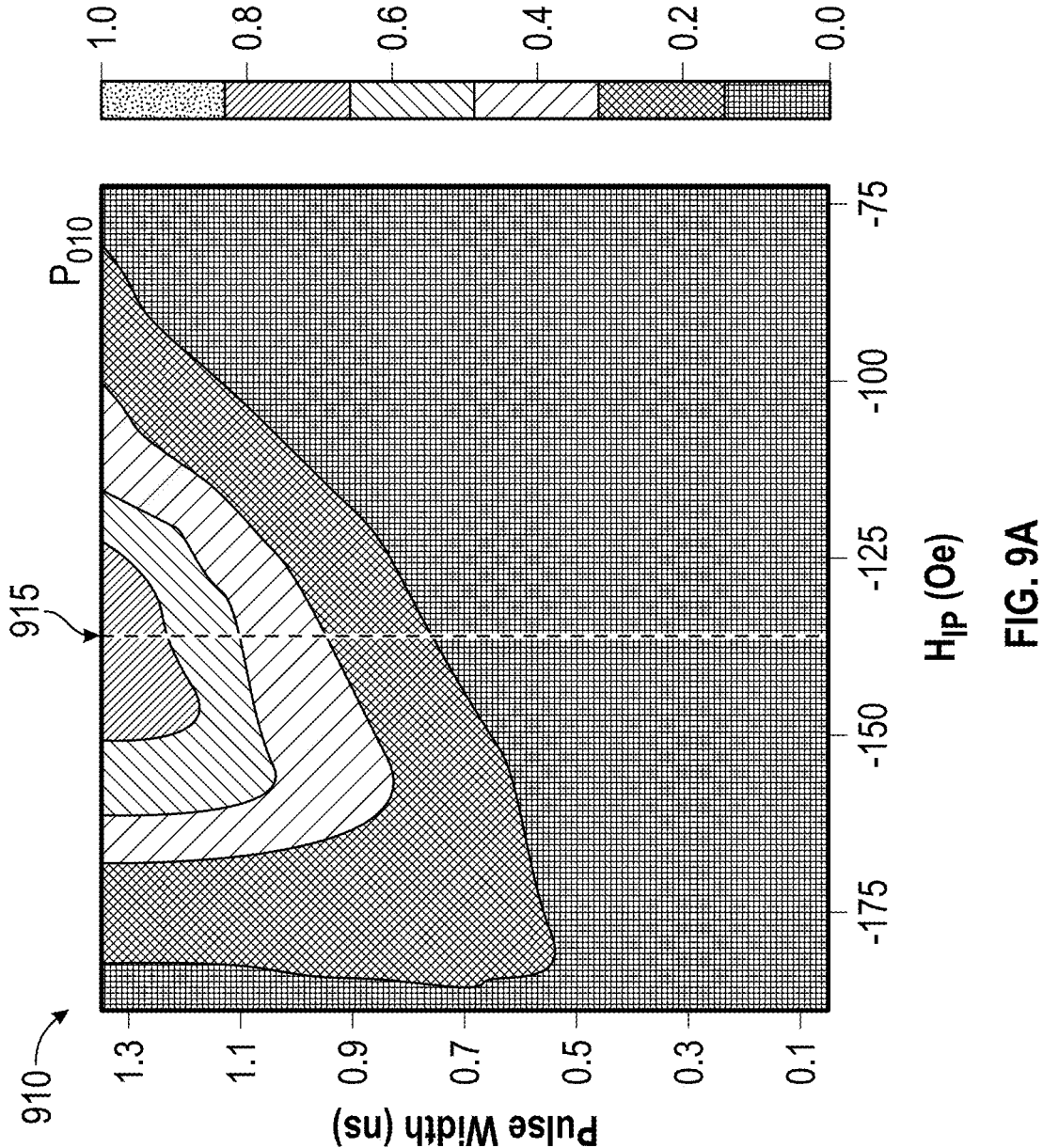
FIG. 9A is an exemplary graph that shows exemplary measured switching probabilities from back and forth switching ($P_{101}$) as a function of in-plane magnetic field HIP and pulse width, for a MTJ device having a diameter of about 30 nm and nominal pulse amplitude of 1.3 V.

FIG. 9A is an exemplary graph 910 that shows exemplary measured switching probabilities from back and forth switching ($P_{101}$) as a function of in-plane magnetic field HIP and pulse width. The back and forth switching from P to AP states and back again to P state, noted as $P_{101}$, was performed for a MTJ 100 device having a diameter of about 30 nm and nominal pulse amplitude of 1.3 V. The vertical dashed line indicates the magnetic field 915 used in measurements shown in FIGS. 10A-10C. The switching probabilities for each pulse width and external magnetic field value pair were calculated based on 1,000 switching attempts with identical voltage pulses.

Figure 9B:
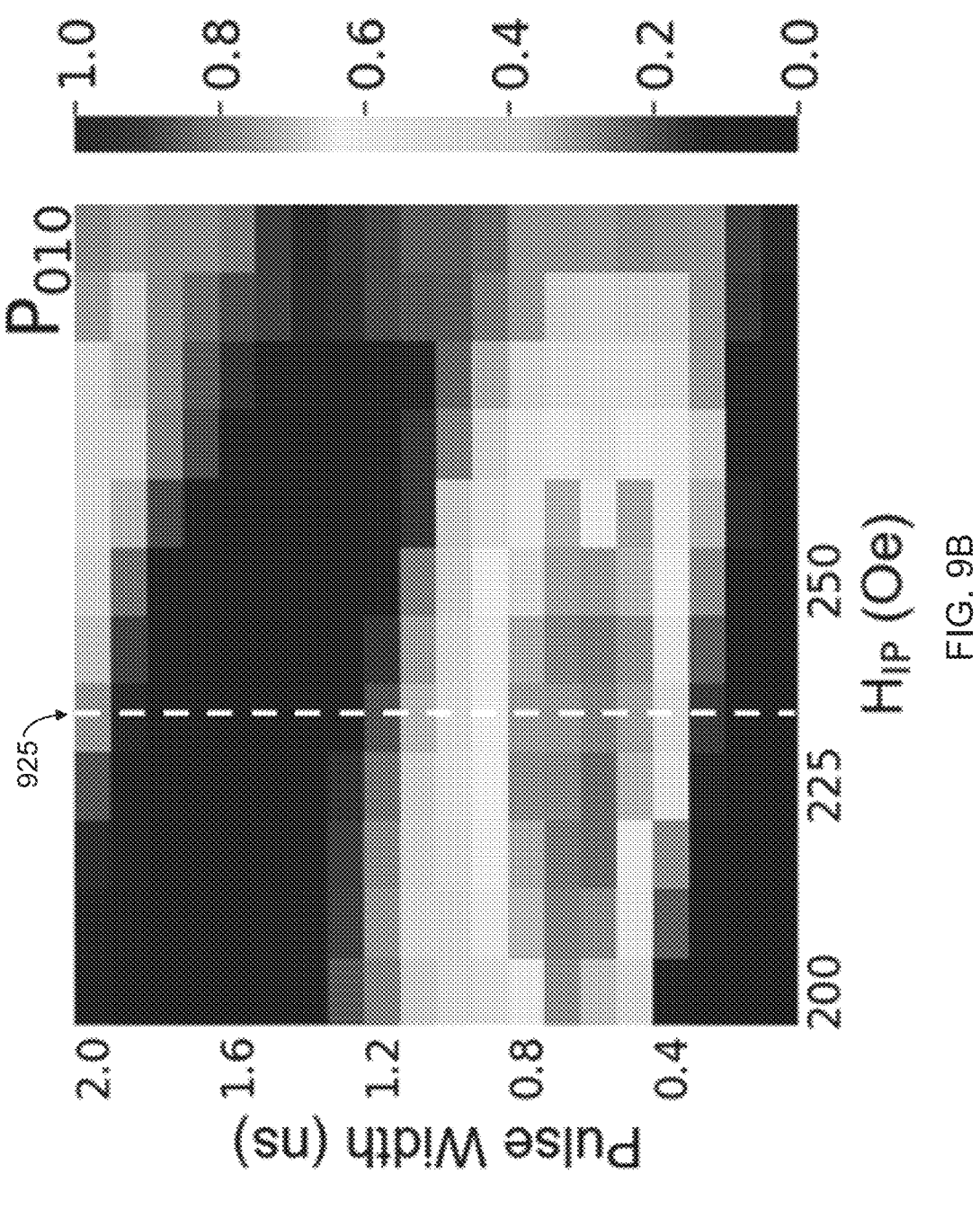
FIG. 9B is an exemplary graph that shows exemplary measured switching probabilities from back and forth switching ($P_{101}$) as a function of in-plane magnetic field HIP and pulse width, for a MTJ device having a diameter of about 50 nm and nominal pulse amplitude of 1.2 V.

FIG. 9B is an exemplary graph 920 that shows exemplary measured switching probabilities from back and forth switching ($P_{101}$) as a function of in-plane magnetic field HIP and pulse width. The back and forth switching from P to AP states and back again to P state, noted as $P_{101}$, was performed for a MTJ 100 device having a diameter of about 50 nm and nominal pulse amplitude of 1.2 V. The vertical dashed line indicates the magnetic field 925 used in measurements shown in FIGS. 11A-11C. The switching probabilities for each pulse width and external magnetic field value pair were calculated based on 1,000 switching attempts with identical voltage pulses.

Figure 10A:
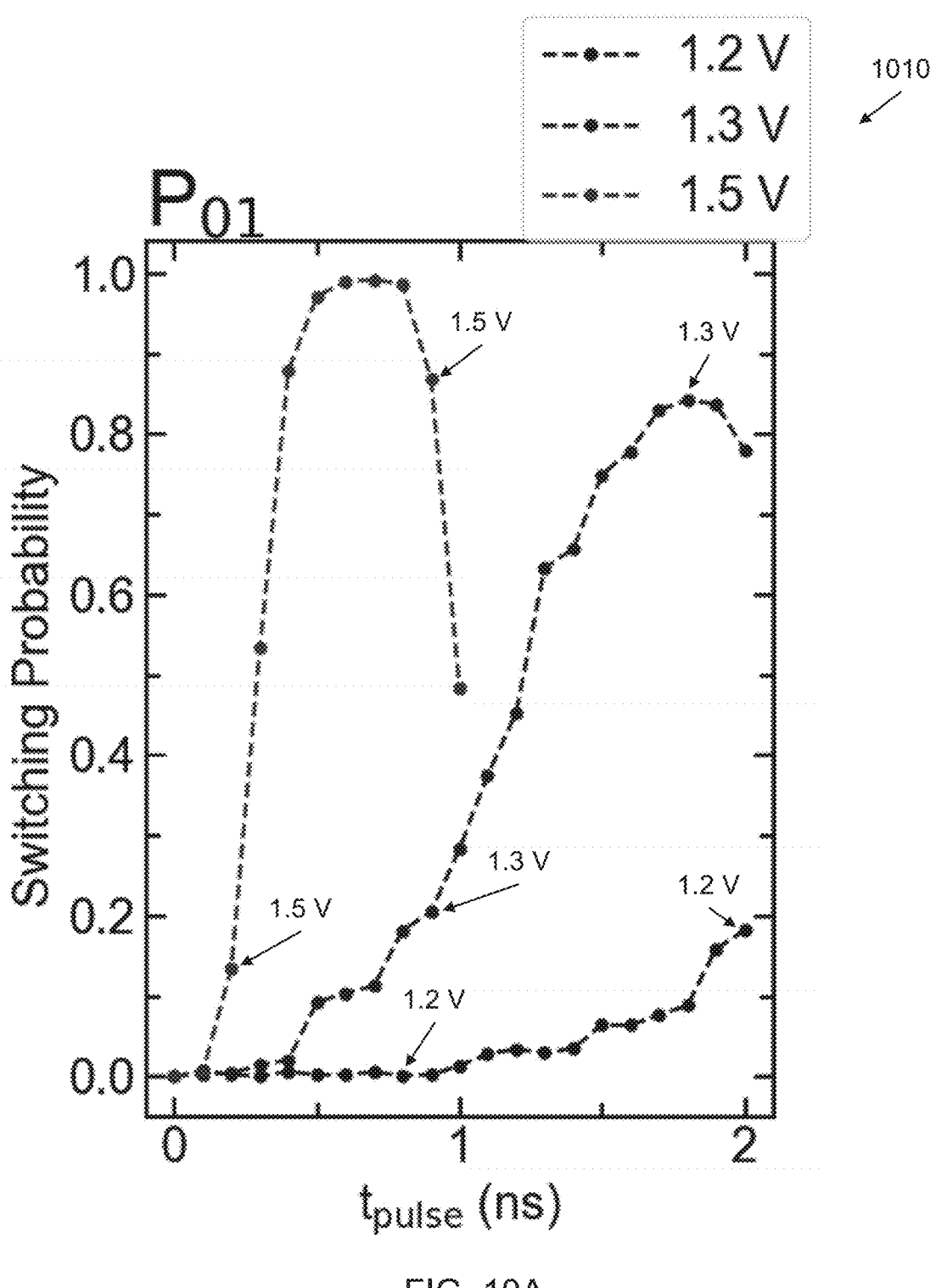
FIG. 10A is an exemplary graph showing exemplary measured switching probabilities from a P state to an AP state ($P_{01}$) as a function of write pulse duration for different nominal pulse voltage amplitudes on the exemplary 30 nm diameter MTJ device whose experimental measurements were used for FIG. 9A.

FIG. 10A is an exemplary graph 1010 showing exemplary measured switching probabilities from a P state to an AP state ($P_{01}$) as a function of write pulse duration for different nominal pulse voltage amplitudes on the exemplary 30 nm diameter MTJ 100 device whose experimental measurements were used for FIG. 9A.

Figure 10B:
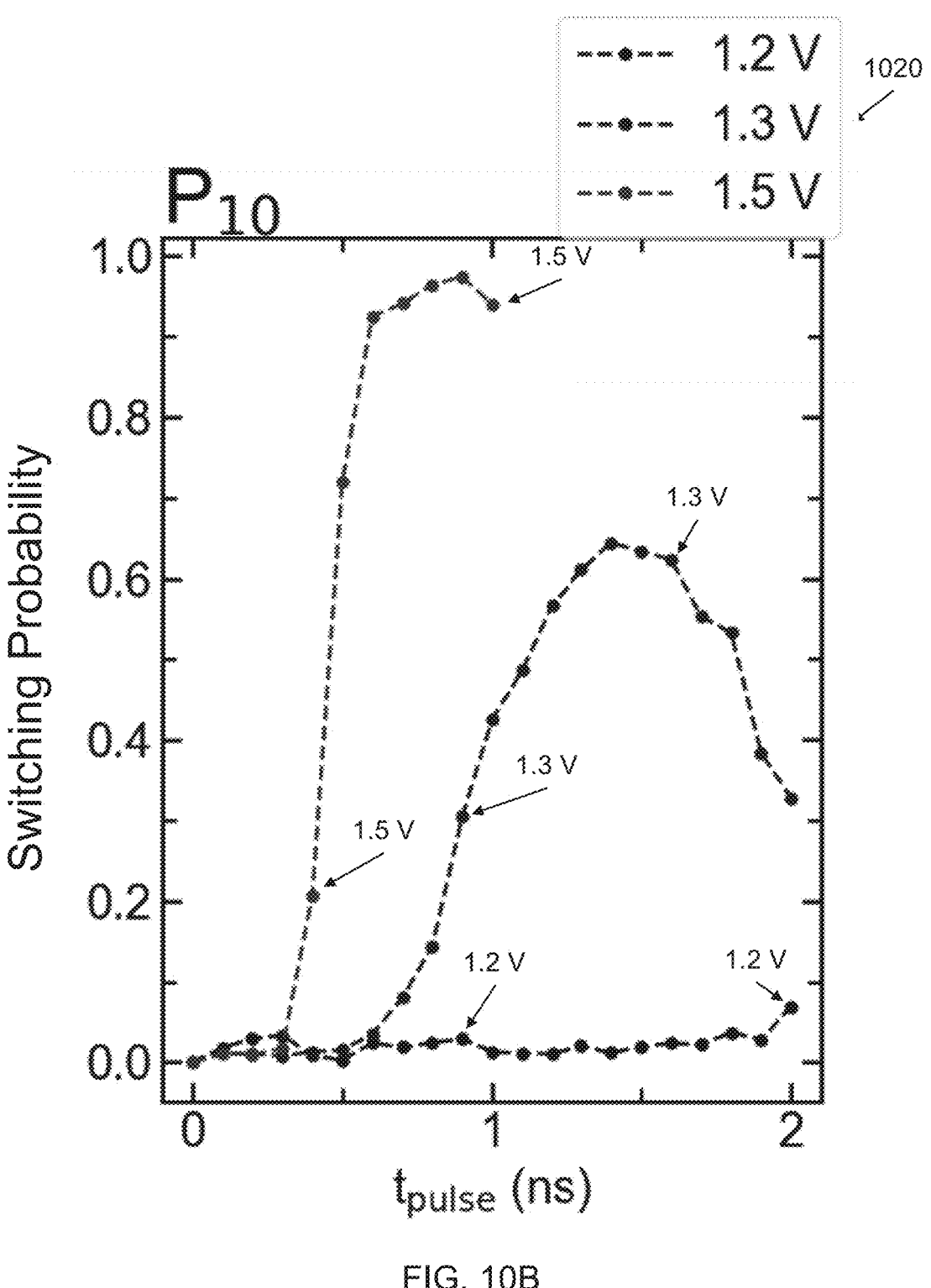
FIG. 10B is an exemplary graph showing exemplary measured switching probabilities from an AP state to a P state ($P_{10}$) as a function of write pulse duration for different nominal pulse voltage amplitudes on the exemplary 30 nm diameter MTJ device whose experimental measurements were used for FIG. 9A.

FIG. 10B is an exemplary graph 1020 showing exemplary measured switching probabilities from an AP state to a P state ($P_{10}$) as a function of write pulse duration for different nominal pulse voltage amplitudes on the exemplary 30 nm diameter MTJ 100 device whose experimental measurements were used for FIG. 9A.

Figure 10C:
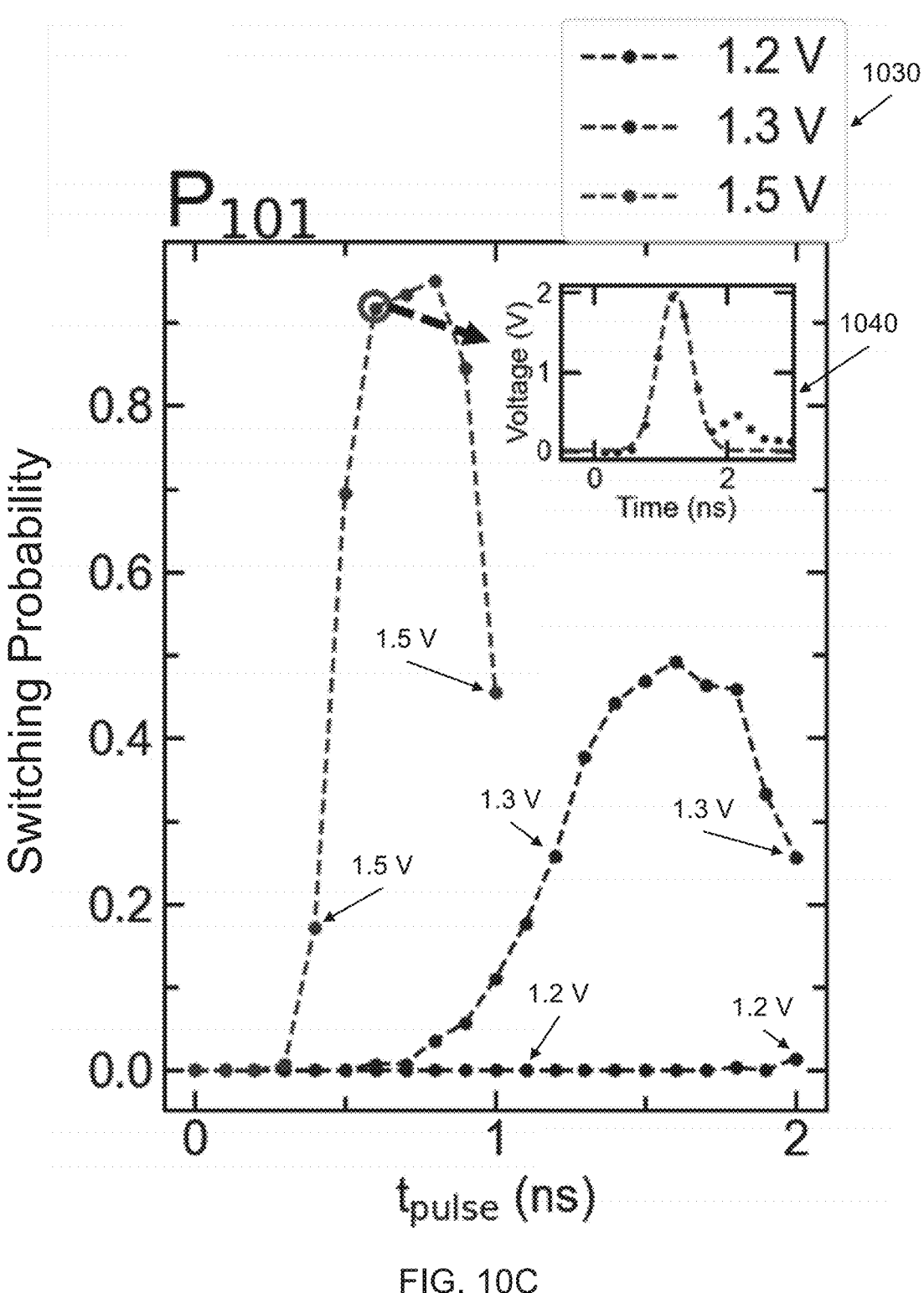
FIG. 10C is an exemplary graph showing exemplary measured switching probabilities from back and forth switching ($P_{101}$) as a function of write pulse duration for different nominal pulse voltage amplitudes on the exemplary 30 nm diameter MTJ device whose experimental measurements were used for FIG. 9A.

FIG. 10C is an exemplary graph 1030 showing exemplary measured switching probabilities from back and forth switching ($P_{101}$) as a function of write pulse duration for different nominal pulse voltage amplitudes on the exemplary 30 nm diameter MTJ 100 device whose experimental measurements were used for FIG. 9A.

The switching probabilities for each pulse duration and nominal pulse voltage amplitude value pair in FIGS. 10A-10C were calculated based on 10,000 write attempts for each pulse voltage amplitude and pulse duration value pair. Switching with >90% probabilities in both directions ($P_{01}$>90%, $P_{10}$>90%, $P_{101}$>81%) was achieved at a 1.5 V nominal amplitude and 0.6 ns write pulse duration. The real shape of the voltage pulse at a particular point in the graph 1030 is illustrated in the inset 1035 of FIG. 10C. The illustrated data points were measured and recorded using an oscilloscope with 1 MΩ input impedance, while the dashed line was fit to the data points with a Gaussian function. The inset 1035 shows a maximum switching voltage amplitude $V_{sw}$ of 2 V.

Figure 11A:
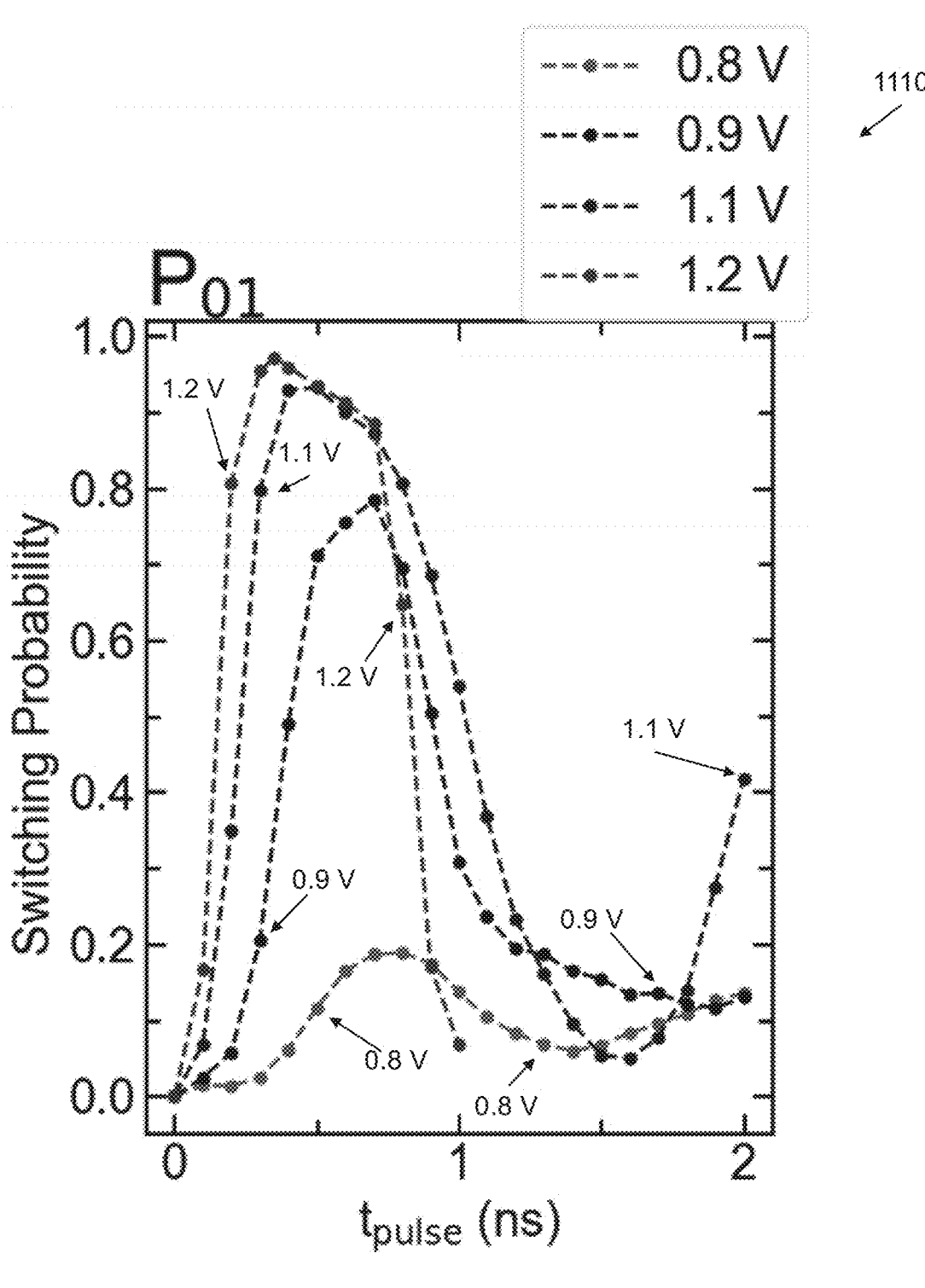
FIG. 11A is an exemplary graph showing exemplary measured switching probabilities from a P state to an AP state ($P_{01}$) as a function of write pulse duration for different nominal pulse voltage amplitudes on the exemplary 50 nm diameter MTJ 100 device whose experimental measurements were used for FIG. 9B.

FIG. 11A is an exemplary graph 1110 showing exemplary measured switching probabilities from a P state to an AP state ($P_{01}$) as a function of write pulse duration for different nominal pulse voltage amplitudes on the exemplary 50 nm diameter MTJ 100 device whose experimental measurements were used for FIG. 9B.

Figure 11B:
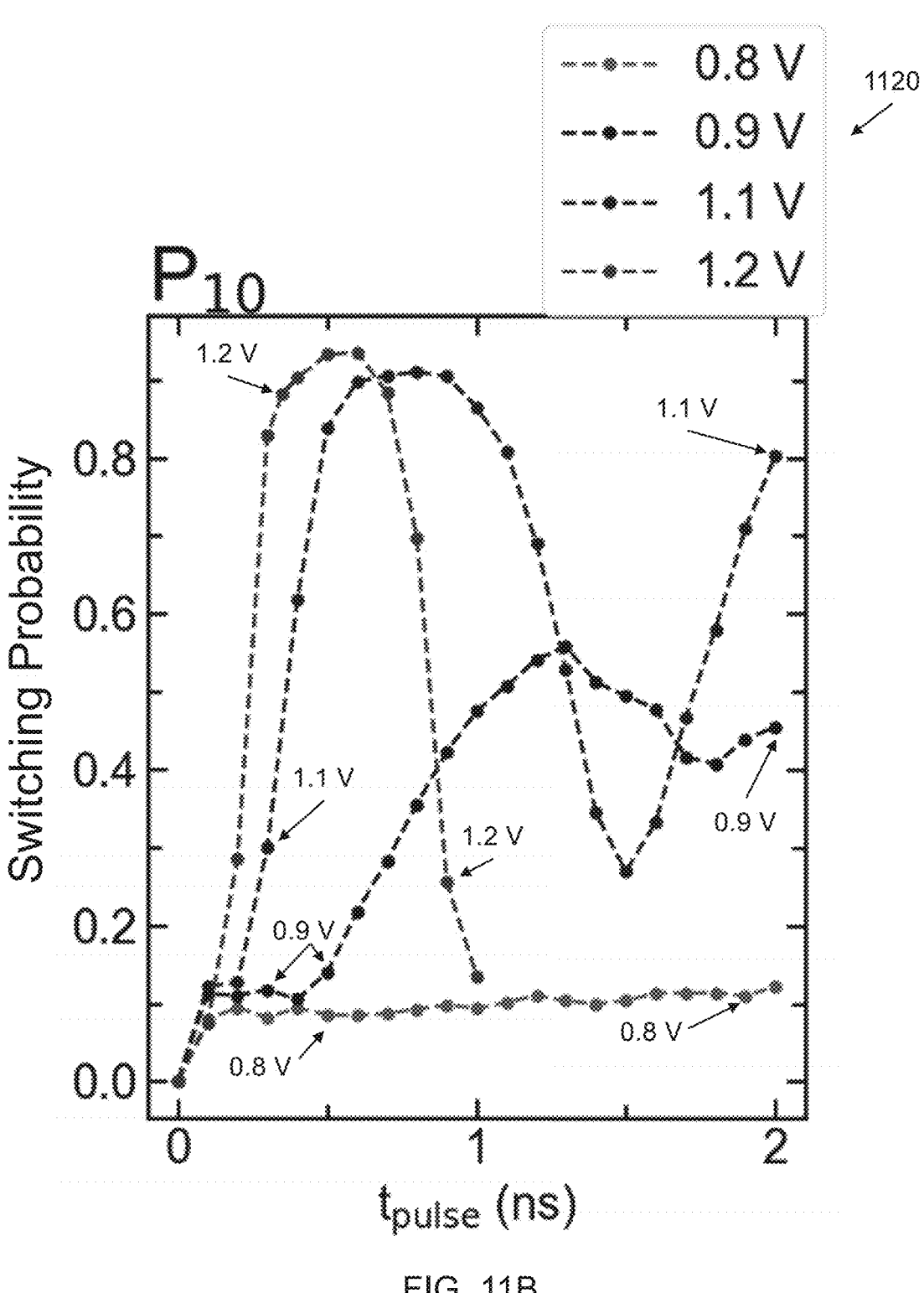
FIG. 11B is an exemplary graph showing exemplary measured switching probabilities from an AP state to a P state ($P_{10}$) as a function of write pulse duration for different nominal pulse voltage amplitudes on the exemplary 50 nm diameter MTJ 100 device whose experimental measurements were used for FIG. 9B.

FIG. 11B is an exemplary graph 1120 showing exemplary measured switching probabilities from an AP state to a P state ($P_{10}$) as a function of write pulse duration for different nominal pulse voltage amplitudes on the exemplary 50 nm diameter MTJ 100 device whose experimental measurements were used for FIG. 9B.

Figure 11C:
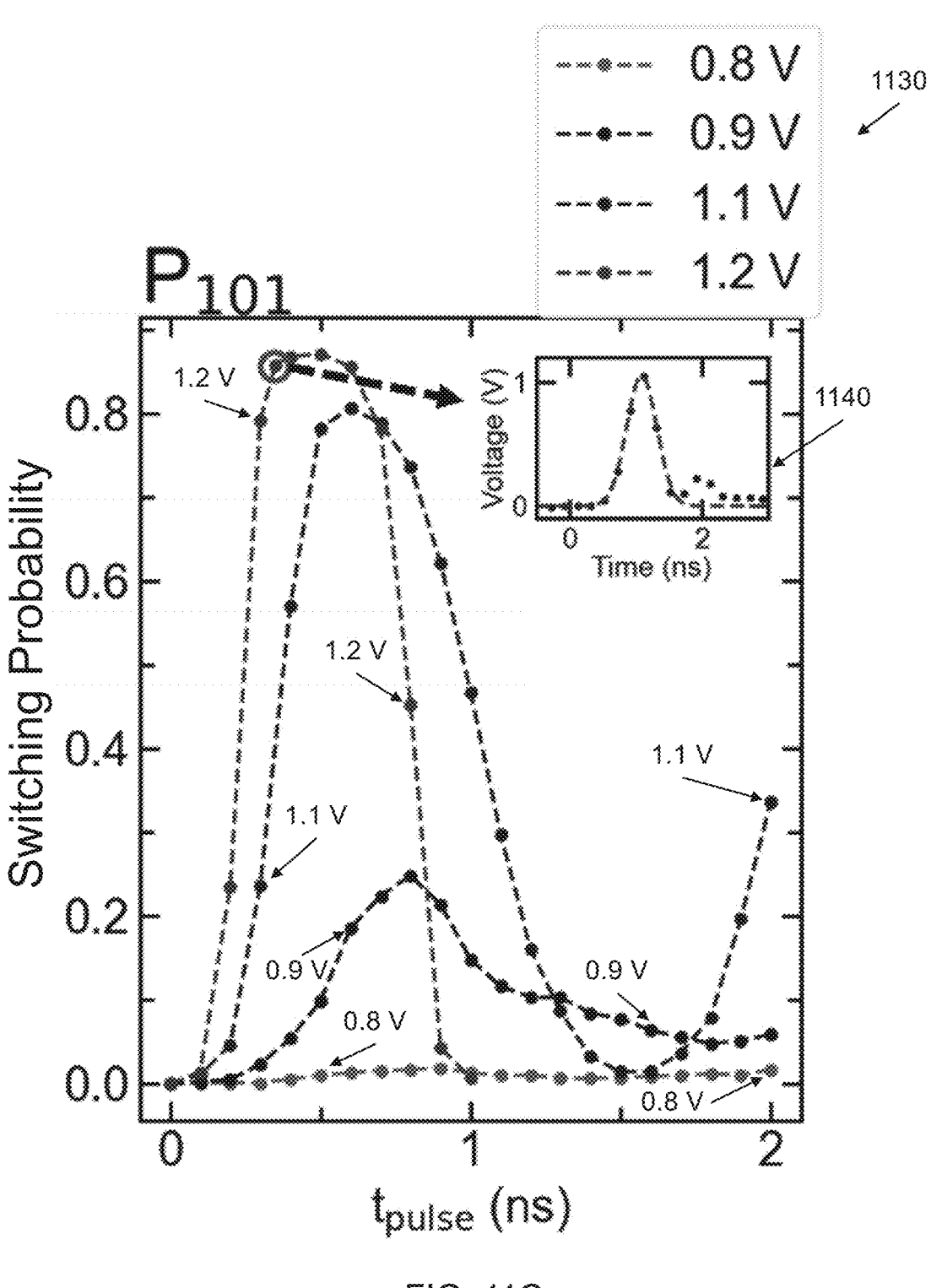
FIG. 11C is an exemplary graph showing exemplary measured switching probabilities from back and forth switching ($P_{101}$) as a function of write pulse duration for different nominal pulse voltage amplitudes on the exemplary 50 nm diameter MTJ 100 device whose experimental measurements were used for FIG. 9B.

FIG. 11C is an exemplary graph 1130 showing exemplary measured switching probabilities from back and forth switching ($P_{101}$) as a function of write pulse duration for different nominal pulse voltage amplitudes on the exemplary 50 nm diameter MTJ 100 device whose experimental measurements were used for FIG. 9B.

The switching probabilities for each pulse duration and nominal pulse voltage amplitude value pair in FIGS. 11A-11C were calculated based on 10,000 write attempts for each pulse voltage amplitude and pulse duration value pair. Switching with >90% probabilities in both directions ($P_{01}$>90%, $P_{10}$>90%, $P_{101}$>81%) was achieved at a 1.2 V nominal amplitude and 0.35 ns write pulse duration. The real shape of the voltage pulse at a particular point in the graph 1030 is illustrated in the inset 1135 of FIG. 11C. The illustrated data points were measured and recorded using an oscilloscope with 1 MΩ input impedance, while the dashed line was fit to the data points with a Gaussian function. The inset 1135 shows a maximum switching voltage amplitude $V_{sw}$ of 1.05 V.

We demonstrated a new Mo-capped bottom-pinned voltage-controlled MTJ 100 structure, with simultaneously high VCMA coefficient and TMR. Using this material structure, for the first time, we demonstrated VCMA switching of nanoscale MTJ 100 devices with a switching voltage lower than 1 V and demonstrated scaling of this switching mechanism down to 30 nm diameter MTJ 100 devices. The role of the Mo capping was further investigated by ab initio calculations, which indicate the importance of local strain on the size and qualitative features of the VCMA effect. Our results discussed herein provide a promising direction for using VCMA-MRAM technology in embedded memory applications, making voltage-controlled MTJ devices compatible with the standard voltage levels of logic transistors.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software or a combination of hardware and software depends upon the particular application and design constraints imposed on the overall system. Skilled artisans may implement the described functionality in varying ways for each particular application.

As used herein, the phrase "at least one of" preceding a series of items, with the terms "and" or "or" to separate any of the items, modifies the list as a whole, rather than each member of the list (e.g., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A magnetic tunnel junction (MTJ) device, comprising:
a bottom electrode;
a bottom CoFeB fixed layer disposed above and in electrical communication with the bottom electrode;
a MgO layer disposed above the bottom CoFeB fixed layer;
a top CoFeB free layer disposed above the MgO layer;
a metal Mo capping layer disposed above the top CoFeB free layer; and
a top electrode disposed above and in electrical communication with the metal Mo capping layer.

2. The MTJ device of claim 1, wherein:
the bottom CoFeB fixed layer comprises $Co_{20}Fe_{60}B_{20}$; and
the top CoFeB free layer comprises $Co_{17.5}Fe_{52.5}B_{30}$.

3. The MTJ device of claim 2, wherein:
the bottom CoFeB fixed layer has a thickness of about 0.8 nm;
the MgO layer has a thickness of about 1.5 nm;
the top CoFeB free layer has a thickness of about 1.6 nm; and
the metal Mo capping layer has a thickness of about 5 nm.

4. The MTJ device of claim 1, wherein the bottom CoFeB fixed layer, the MgO layer, the top CoFeB free layer, and the metal Mo capping layer are patterned into a circular vertically-oriented pillar.

5. The MTJ device of claim 4, wherein the circular vertically-oriented pillar has a diameter within a range from about 50 nm to about 70 nm.

6. The MTJ device of claim 4, wherein the circular vertically-oriented pillar has a diameter within a range from about 30 nm to about 50 nm.

7. The MTJ device of claim 1, wherein the bottom electrode includes a Co/Pt-based synthetic antiferromagnetic (SAF) multilayer.

8. The MTJ device of claim 1, wherein the bottom CoFeB fixed layer and the top CoFeB free layer each have a composition ratio of 1:3 between Co and Fe, and the top CoFeB free layer has a higher B concentration than the bottom CoFeB fixed layer.

9. The MTJ device of claim 1, further comprising a plurality of MTJ devices and electronic circuitry coupled with the plurality of MTJ devices and the MTJ device of claim 1 and configured as a complementary metal oxide semiconductor (CMOS)-compatible magnetic random-access memory (MRAM).

10. A method of fabricating a voltage-controlled magnetic anisotropy (VCMA) magnetic tunnel junction (MTJ) device, comprising:
forming a plurality of layers in a perpendicularly rising sequence above a bottom electrode, the plurality of layers comprising a bottom CoFeB fixed layer disposed above and in electrical communication with the bottom electrode, a MgO layer disposed above the bottom CoFeB fixed layer, a top CoFeB free layer disposed above the MgO layer, a metal Mo capping layer disposed above the top CoFeB free layer, and a top electrode disposed above and in electrical communication with the metal Mo capping layer;
performing thermal annealing; and
patterning the plurality of layers into a circular pillar.

11. The method of claim 10, wherein the plurality of layers further comprises a pinning layer between the bottom electrode and the bottom CoFeB fixed layer.

12. The method of claim 10, wherein forming the plurality of layers comprises sputter depositing using physical vapor deposition.

13. The method of claim 10, wherein the circular pillar is patterned with a diameter within a range of about 30 nm to about 50 nm.

14. The method of claim 10, wherein the circular pillar is patterned with a diameter within a range of about 50 nm to about 70 nm.

15. The method of claim 10, wherein the circular pillar is patterned using electron beam lithography.

16. The method of claim 10, wherein the MgO layer is deposited by radio-frequency (RF) sputtering.

17. The method of claim 10, wherein layers comprising metallic compounds are deposited by DC sputtering.

18. A method of switching a free-layer magnetization state of a voltage-controlled magnetic anisotropy (VCMA) magnetic tunnel junction (MTJ) device patterned as a circular pillar comprising a plurality of layers in arranged in a perpendicularly rising sequence above a bottom electrode, the plurality of layers including a bottom CoFeB fixed layer disposed above and in electrical communication with the bottom electrode, a MgO layer disposed above the bottom CoFeB fixed layer, a top CoFeB free layer disposed above the MgO layer, a metal Mo capping layer disposed above the top CoFeB free layer and in electrical communication with a top electrode thereabove, the method comprising:

applying a magnetic field H across the top CoFeB free layer of the MTJ device along an axis;

applying a switching voltage $V_{SW}$ between the top electrode and the bottom electrode of the MTJ device, where $V_{SW}=4t_{MgO}E_b(V=0)/(\pi\xi D^2)$, $t_{MgO}$ is a thickness of the MgO layer, $E_b$ is an energy barrier between two free-layer magnetization states, $\xi$ is a VCMA coefficient, and D is a diameter of the MTJ device; and removing the switching voltage $V_{SW}$ after the switching voltage $V_{SW}$ has been applied for a switching time $t_{SW}$ corresponding to a half period of a magnetic moment precession of the top CoFeB free layer.

19. The method of claim 18, wherein the axis, along which the magnetic field H is applied, is offset by an angle $\theta_H$ from normal to a plane of the plurality of layers of the MTJ device.

\* \* \* \* \*